United States Patent
Schroeder

(10) Patent No.: US 11,698,403 B2
(45) Date of Patent: Jul. 11, 2023

(54) RESIDENTIAL FAULT DIAGNOSTIC TOOL

(71) Applicant: Schneider Electric USA, Inc., Andover, MA (US)

(72) Inventor: Jeremy D. Schroeder, Cedar Rapids, IA (US)

(73) Assignee: Schneider Electric USA, Inc., Boston, MA (US)

( * ) Notice: Subject to any disclaimer, the term of this patent is extended or adjusted under 35 U.S.C. 154(b) by 211 days.

(21) Appl. No.: 17/124,847

(22) Filed: Dec. 17, 2020

(65) Prior Publication Data

US 2022/0196722 A1  Jun. 23, 2022

(51) Int. Cl.
*G01R 31/12* (2020.01)
*G01R 31/08* (2020.01)
*H02H 1/00* (2006.01)
*H02H 7/26* (2006.01)

(52) U.S. Cl.
CPC ....... *G01R 31/1272* (2013.01); *G01R 31/086* (2013.01); *H02H 1/0015* (2013.01); *H02H 7/26* (2013.01)

(58) Field of Classification Search
CPC .. G01R 31/1272; G01R 31/086; G01R 31/52; G01R 19/2513; G01R 31/282; H02H 1/0015; H02H 7/26
USPC .......................................................... 361/42
See application file for complete search history.

(56) References Cited

U.S. PATENT DOCUMENTS

| | | | |
|---|---|---|---|
| 8,503,148 B2 | 8/2013 | Schroeder et al. | |
| 8,674,823 B1 | 3/2014 | Contario et al. | |
| 10,114,057 B2 * | 10/2018 | Beierschmitt | H02H 1/0015 |
| 10,181,714 B2 * | 1/2019 | Schroeder | H02H 3/28 |
| 2014/0211345 A1 * | 7/2014 | Thompson | B60L 53/665 335/11 |
| 2015/0109077 A1 | 4/2015 | Tomimbang et al. | |

(Continued)

FOREIGN PATENT DOCUMENTS

WO  WO-2015002633 A1 *  1/2015  ........... H02H 1/0015

OTHER PUBLICATIONS

Extended European Search Report dated May 27, 2022 for corresponding European Patent Application No. 21211786.5-1001, 6 pages.

*Primary Examiner* — Dharti H Patel
(74) *Attorney, Agent, or Firm* — Locke Lord LLP

(57) ABSTRACT

A diagnostic device includes electrical connectors, load, power supply, switching circuitry, sensors, and processor. The connectors include first and second sets of terminals for connecting to the conductors of a branch circuit in an upstream and downstream direction, respectively, at an outlet location along the circuit. The switching circuitry can isolate the upstream and downstream sections of the circuit from the outlet location, and selectively connect or disconnect the power supply or the load to the upstream or downstream section. The sensors measure electrical characteristics on the conductors of the circuit to monitor load currents, such as on power, neutral and ground lines, of the upstream and downstream circuit sections. The processor controls the switching circuitry, and obtains diagnostic information corresponding to the monitored load currents on the upstream and downstream sections of the branch circuit, from the measurements performed by the sensors.

18 Claims, 15 Drawing Sheets

(56) References Cited

U.S. PATENT DOCUMENTS

| | | | |
|---|---|---|---|
| 2016/0202304 A1* | 7/2016 | Beierschmitt | H02H 3/10 |
| | | | 324/750.01 |
| 2018/0152015 A1 | 5/2018 | Cheng et al. | |
| 2019/0386479 A1* | 12/2019 | Packard | H02H 3/044 |

* cited by examiner

RESIDENTIAL FAULT DIAGNOSTIC TOOL

TECHNICAL FIELD

The present disclosure relates to circuit diagnostics, and more particularly, to a device, system and method for facilitating or performing circuit diagnosis of a residential branch circuit in an electrical system.

BACKGROUND

Advanced residential circuit breakers can detect and interrupt faults on a circuit beyond the standard overcurrent faults. Additional faults detected may include various types of arcing faults and ground faults. These circuit breakers may even provide some type of feedback as to the last fault type, which has caused the circuit breaker to interrupt power on a circuit. For some advanced residential circuit breakers to receive such feedback, the user may need to close the circuit breaker and risk energizing a fault which can present a hazard. Also, an advanced residential circuit breaker closing on a fault may trip almost instantaneously, thereby interrupting the feedback process and causing confusion for the user. Furthermore, after the occurrence of a fault on a branch circuit, investigating for a location of the fault inside of a wall(s) can become a destructive and expensive process, especially with branch circuits sometimes consisting of over 100 feet of wire inside a wall(s).

SUMMARY

A diagnostic device is provided for performing diagnostics on a branch circuit of an electrical system, the branch circuit having a plurality of electrical conductors including a power line, neutral line and ground line. The diagnostic device can include electrical connectors, a load, a power supply, switching circuitry, sensors and at least one processor. The electrical connectors include a first set of terminals for connecting to the electrical conductors of the branch circuit in an upstream direction at an electrical outlet location, and a second set of terminals for connecting to the electrical conductors of the branch circuit in a downstream direction at the electrical outlet location. The switching circuitry, which is coupled to the first and second sets of terminals of the electrical connectors, the load and the power supply, can isolate an upstream or downstream section of the branch circuit from the electrical outlet, and selectively connect or disconnect the power supply or the load to the section of the branch circuit upstream or downstream from the electrical outlet location, via the electrical connectors. The sensors can measure electrical characteristics of the electrical conductors on the branch circuit to monitor current on the power, neutral and ground lines Then at least one processor can be configured: to control the switching circuitry to selectively connect either the power supply or the load to the portion of the branch circuit either upstream or downstream from the electrical outlet location; and to obtain diagnostic information corresponding to the monitored current on the power, neutral and ground lines based on the measurements performed by the sensors.

In various embodiments, the load is a variable load, and the processor is further configured to set the variable load to a load level which is different than other loads connected on the branch circuit. The power supply is a variable power supply, and the processor is further configured to control an amount of power supplied by the variable power supply to the isolated section of the branch circuit either upstream or downstream from the electrical outlet location.

In various embodiments, the switching circuitry is operable in first and second switching configurations in which the upstream and downstream sections of the branch circuit are isolated from each other at the electrical outlet location, the first switching configuration connecting the power supply to the upstream section and the load to the downstream section, the second switching configuration connecting the power supply to the downstream section and the load to the upstream section. Furthermore, the power level of the power supply can be controllable to output voltage at a selectable level from one of a first voltage level that can energize an arc fault and a second voltage level that cannot energize an arc fault. A level of voltage supplied by the power supply and/or a level of load connectable to the branch circuit can selectively controllable to limit current on the branch circuit to a current level which can prevent or reduce a potential hazardous arc fault from reaching a hazardous level.

In accordance with a further embodiment, a diagnostic system can include: a circuit breaker, arranged at an origin of the branch circuit, the circuit breaker including a load selectively connectable to the branch circuit; and a plurality of the diagnostic devices of claim 1, each of which is configured to connect to the electrical conductors of the branch circuit at a different electrical outlet location along the branch circuit, the switching circuitry of the plurality of diagnostic devices being operable to provide different combinations of power supply and load connections along the branch circuit to isolate and monitor load currents on different sections of the branch circuit including sections between electrical outlet locations having diagnostic devices connected thereto. A type and location of a fault on the branch circuit is determined based on the monitored load currents, or a mapping of electrical outlet locations along the branch circuit is determined based on the monitored load currents.

In some embodiments, each of the plurality of diagnostic devices and the circuit breaker includes a communication device. The system can further include a computer device including a processor, memory and a communication device, the computer device being configured: to remotely control operations of the circuit breaker and the plurality of diagnostic devices for selectively isolating different sections of the branch circuit and monitoring load currents on the isolated sections of the branch circuit; to receive diagnostic information from the circuit breaker and the plurality of the diagnostic devices via the communication device of the computer device, the received diagnostic information including information corresponding to the monitored load currents for the different sections of the branch circuit; and to determine the type and location of a fault on the branch circuit based on the received diagnostic information, or the mapping of the electrical outlet locations along the branch circuit based on the received diagnostic information.

In various system embodiments, the computer device can further be configured to report to a user the type and location of a fault or the mapping of the electrical outlet locations. The computer device can be configured to control the diagnostic devices and the circuit breaker to obtain diagnostic information for use to analyze one or more types of faults defined by a user via a user input device, or defined by a type(s) of fault protected against by the circuit breaker. The system can further include a ground break switch to selectively disconnect ground upstream from the plurality of electrical outlet locations, the ground break switch being operable to disconnect ground when monitoring load currents for detecting ground fault and distinguish line-to-neutral parallel fault and line-to-ground parallel fault along the section of the branch circuit between the circuit breaker and a closest one of the electrical outlet locations to the circuit breaker which has a diagnostic device connected thereto.

In accordance with a further embodiment, a method is provided for performing diagnostics on a branch circuit with a plurality of electrical outlet locations in an electrical system. The branch circuit has a plurality of electrical conductors including a power line, neutral line and ground line. The method involves connecting a plurality of diagnostic devices to upstream and downstream electrical conductors of the branch circuit at different electrical outlet locations. Each diagnostic device includes: a load, a power supply, sensors for measuring electrical characteristics on the branch circuit to monitor current on the power, neutral and ground lines, and switching circuitry for isolating an upstream or downstream section of the branch circuit from the electrical outlet and for selectively connecting or disconnecting the power supply or the load to the section of the branch circuit upstream or downstream from the electrical outlet location, via the electrical connectors. The method further involves controlling the switching circuitry of each of the plurality of diagnostic devices to provide different combinations of power supply and load connections along the branch circuit in order to isolate and monitor load currents on different sections of the branch circuit including sections between electrical outlet locations having diagnostic devices connected thereto; and determining a type and location of a fault on the branch circuit based on the monitored load currents, or a mapping of the outlet locations along the branch circuit based on the monitored load currents.

In various embodiments, the diagnostic operations can be performed under control of a computer device, and the determining operation is performed by the computer device based on diagnostic information corresponding to monitored loads, which are received from the plurality of diagnostic devices. The loads of at least one of the diagnostic devices or the circuit breaker can be a variable load, and the method can further involve setting the variable load to a load level which is different than other loads connected on the branch circuit. The power supply of one of the diagnostic devices can be a variable power supply, and the method can further involve controlling a level of power supplied by the variable power supply to the section of the branch circuit either upstream or downstream from the electrical outlet location at which the one of the diagnostic devices is connected.

The method can further involve controlling the power level of the power supply of one or more of the diagnostic devices to output voltage at a selectable level from one of a first voltage level that can energize an arc fault and a second voltage level that cannot energize an arc fault. The method can also involve selectively controlling a level of voltage supplied by the power supply and/or a level of load on the branch circuit to limit current on the branch circuit to a current level which can prevent or reduce a potential hazardous arc fault from reaching a hazardous level.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Figure 1:
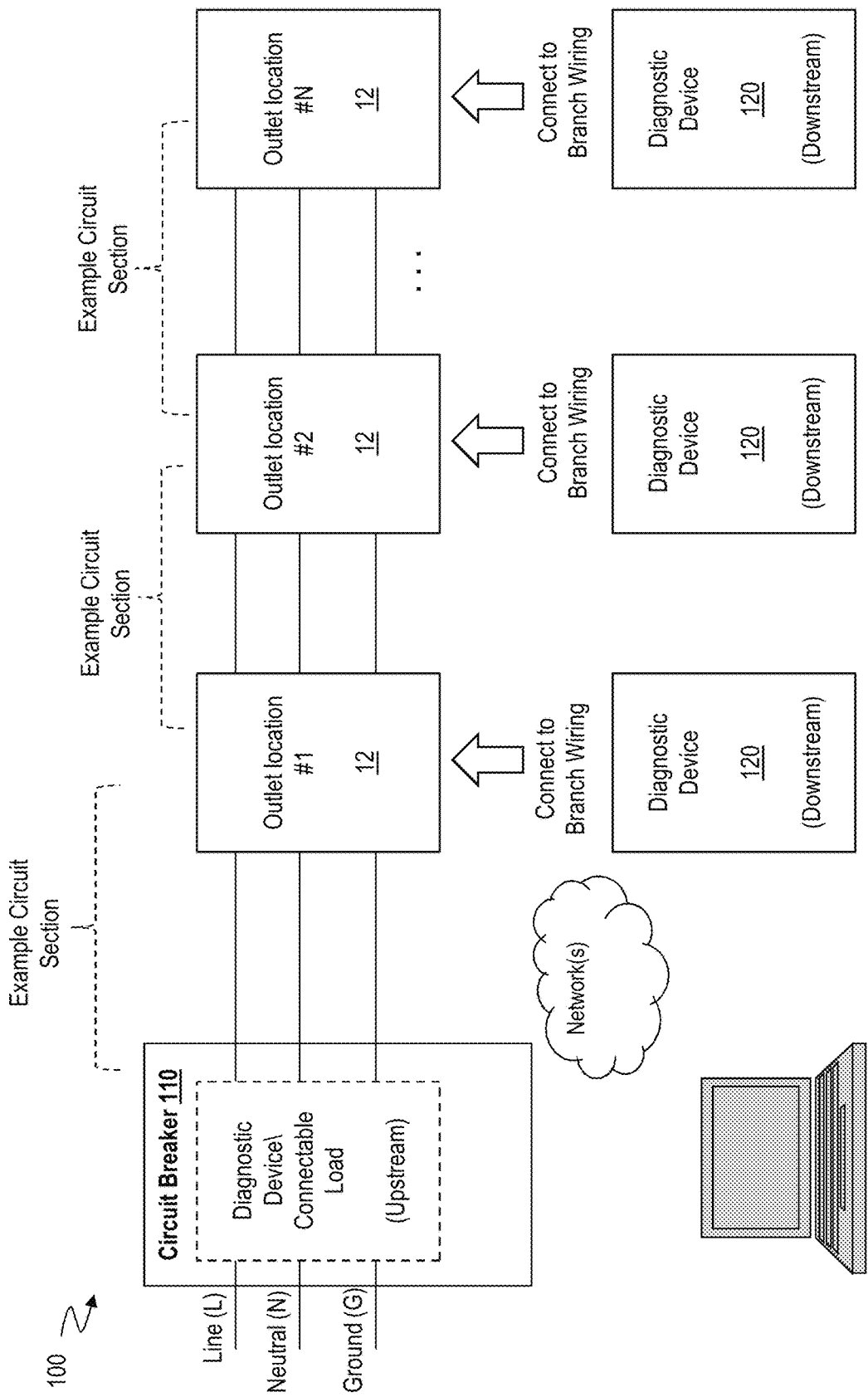
FIG. 1 is a block diagram illustrating a diagnostic system for diagnosing a state of a circuit, such as a branch circuit, in accordance with an embodiment.

This idea provides the benefit of determining fault type and a location without having to close the circuit breaker or expose unnecessary sections of the branch circuit.

Identical reference numerals have been used, where possible, to designate identical elements that are common to the figures. However, elements disclosed in one embodiment may be beneficially utilized on other embodiments without specific recitation.

DETAILED DESCRIPTION

The present disclosure is directed to a system and method for diagnosing a state of a circuit, such as for example a branch circuit of an electrical system in a residential building. The system and method can employ a plurality of diagnostic devices (also referred to as "diagnostic boxes"), which can be installed/connected to wiring of the branch circuit at different electrical outlet or receptacle locations (also referred to as "outlet location") along the circuit to perform circuit diagnostics. Each diagnostic device can include: a processor(s); communication device; a power supply; a different or unique load; electrical connectors with first and second sets of terminals to connect to the circuit in the upstream and downstream direction, respectively, from the electrical outlet location; sensor(s); and switching circuitry for isolating the upstream and downstream sections of the branch circuit at from the outlet location and selectively connecting or disconnecting components of the diagnostic device to or from, respectively, either the upstream or downstream sections of the branch circuit. The sensors can include current sensor(s), voltage sensor(s) or a combination thereof, which can measure electrical characteristics on the conductors of the branch circuit or sections thereof in order to monitor load currents on the branch circuit or section(s) thereof. The load currents can include currents on the various electrical conductors (or wiring) of the branch circuit, such as on the power or hot line (L), neutral line (N), and ground line (or earth ground) (G)), when a power supply and a load is connected to a circuit section being monitored.

In various embodiments, the diagnostic device is configured to connect the power supply to the circuit in one of the upstream and downstream direction from the electrical outlet location, and at the same time, connect the load to the other one of the upstream and downstream direction from the electrical outlet location. The diagnostic device also is configured to reverse the connections of the power supply and load to the branch circuit sections, via switching circuitry.

The circuit breaker at the branch origin also can be a smart circuit breaker, which can incorporate components and features of a diagnostic device along with a trip unit and other breaker components for interrupting, turning on, or turning off power to the branch circuit. For example, the circuit breaker can also include a processor(s), communication device, switching circuitry, sensor(s), and a unique or different load. The load can be selectively connected to or disconnected from the branch circuit, when the circuit breaker is in the off or tripped state (or position). The circuit breaker may also include an isolated power supply. The circuit breaker can conduct wireless or wireline communication with other remote devices, via the communication device, over a network such as a star, mesh or other network.

In an example diagnostic operation, a plurality of diagnostic devices can be installed/connected to the branch circuit at different electrical outlet locations along a branch circuit to be monitored. For instance, a diagnostic device can be connected to the upstream and downstream wirings at each electrical outlet location along the branch circuit, unless the outlet location is the end of the branch circuit in which case no downstream connection is necessary. When the branch circuit is in the powered down state (e.g., the circuit breaker is turned off or tripped), the diagnostic devices can be selectively operated to implement different power supply and load connection scenarios to isolate different sections along the branch circuit, and to monitor (e.g., measure, sense, calculate or derive) load currents on the isolated sections to gather diagnostic information corresponding thereto. The isolated sections can, for example, include those between outlet locations having a diagnostic device connected thereto, and between the circuit breaker and the closest outlet location from the circuit breaker with a diagnostic device connected thereto. The gathered diagnostic information can be used to map electrical outlet/outlet locations along the branch circuit, to identify a type and location of a fault in the circuit, and/or to diagnose other conditions on the circuit. Different power supply and/or load connection scenarios for the diagnostic devices and the circuit breaker can be implemented according to the desired diagnostics to be performed, e.g., outlet mapping, fault type and location identification, series fault detection, ground fault detection, parallel fault detection, etc. For example, a low voltage supply can be used when performing diagnostics, such as outlet mapping, and series and ground fault detection; a high (or higher) voltage supply can be used when performing diagnostics, such as parallel fault detection including parallel line-to-neutral and line-to-ground fault detection.

A smart device, such as a computer device operating a circuit diagnostic application software, can be used to remotely control and coordinate the operations of the diagnostic devices and the circuit breaker, and to perform various circuit diagnostic analysis, including outlet mapping and/or identification of type and location of fault(s) on the circuit, using diagnostic information gathered from the diagnostic devices (and if desired other device(s)) connected to the branch circuit. The smart device can be a user-operable computer device.

In various embodiments, each load of the diagnostic devices and the circuit breaker can be a variable load, which can be selectively set at different load levels (e.g., levels, amounts, values, etc.) to differentiate the devices from one another. The diagnostic devices and other devices on the branch circuit can have unique identifiers to facilitate identification thereof. Each diagnostic device also can include a variable power supply, which can supply power at a desired current or voltage level according to circumstances or conditions. For example, the supplied current or voltage from the power supply may be limited at or below a current or voltage level, which does not energize an arc fault, such as when mapping or identifying the order of the outlets on the branch circuit. In the event that the circuit breaker has been tripped due to some fault, the diagnostic devices also can be operated to supply power at a safe, increased current or voltage level, which is able to safely energize a fault, when diagnosing the circuit to determine the type and location of the fault on the circuit. The diagnostic process also can be set to perform searches for particular types of faults according to user input, based on the fault protection capabilities of the circuit breaker, based on the fault detected by the circuit breaker which resulted in the interruption of power to the branch circuit, or based on other conditions or factors.

The circuit diagnostic system and method of the present disclosure can be implemented without having to access a load panel (or its circuit breaker(s)) or without having to unnecessarily expose sections of the branch circuit (e.g., tearing apart or damaging walls to access circuit wiring). Furthermore, in the event the circuit breaker of the branch circuit is tripped, the diagnostic devices can be used to monitor or test conditions on the branch circuit and their electrical lines in order to determine the type and location of the fault on the branch circuit, without having to close (or turn on) a circuit breaker in the tripped or off state.

These and other example features of the present disclosure will be described below in further detail with reference to the figures.

FIG. 1 illustrates an example diagnostic system 100 for diagnosing a state of a circuit, such as a branch circuit 10 having a plurality of electrical outlet locations 12 along the circuit. The diagnostic system 100 includes a circuit breaker 110, a plurality of diagnostic devices 120, and a smart device 130 such as computer device, which can communicate with each other over a network(s) such as a star, mesh or other network.

Each diagnostic device 120 can be a portable unit, which can be connected to the branch circuit wirings (e.g., L, N and G lines). The diagnostic device 120 is connectable to the upstream direction branch circuit wiring and the downstream direction branch circuit wiring, at an electrical outlet location 12. As will be described in further detail below, the diagnostic device can include electrical connectors, a load, a power supply, switching circuitry, a processor(s) and a communication device. The diagnostic device 120 can be operated to isolate sections of the branch circuit, which are upstream and downstream from the electrical outlet location 12, and to selectively connect either the power supply or the load to the upstream or downstream section of the branch circuit 10. The diagnostic device 120 can further obtain diagnostic information corresponding to the monitored current on the power, neutral and/or ground lines based on the measurements by the sensors of electrical characteristics on conductors of the isolated sections. When performing diagnostics on the branch circuit 10, the load of each of the diagnostic devices 120 and the circuit breaker 110 can be configured to have a different load level to differentiate and identify them from each other.

The circuit breaker 110 can be arranged at an origin of the branch circuit 10, and may reside in a load center or panel board, which includes a plurality of circuit breakers connected to protect different branch circuits. The circuit breaker 110 can be operated to turn power on or off to the branch circuit. The circuit breaker 110 can also include a trip unit, which is configured to trip and interrupt power to the branch circuit 10 in the event of a triggering event or condition, such as a fault (e.g., arc fault, ground fault, overload, etc.). The circuit breaker 110, which can be a smart breaker, may also include a load such as a variable load which is selectively connectable to the branch circuit, a plurality of sensors for sensing conditions on the branch circuit, switching circuitry to selectively connect (or disconnect) components of the circuit breaker 110 to each other or to the branch circuit, a processor(s) to control the components and operations of the circuit breaker 110, and a communication device for communicating with a remote device(s). The sensors may include an arc fault sensor, a ground fault sensor, sensors for monitoring currents on the branch circuit lines (e.g., lines, conductors, wiring, etc.) such as the power or hot (L) line, neutral (N) line, and ground (G) line (or earth ground), and other types of sensors for sensing conditions on the branch circuit. In various embodiments, the circuit breaker 110 may include an isolated power supply. The circuit breaker 110 may also be configured to implement functions and operations, such as described herein for the diagnostic device 120. In various embodiment, the circuit breaker 110 can be powered by a power supply (e.g., from the diagnostic device 120) on the load side lugs, in a non-protective diagnostic mode.

The smart device 130 can include a processor(s), memory, input/output devices, and a communication device. The smart device can be a computer device (or system), such as a smartphone, tablet computer, laptop or other computer device operable by a user (e.g., a technician). The smart device 130 can be configured to implement circuit diagnostic processes or methods, including those described herein. For example, the smart device 130 can be configured to: remotely control and coordinate operations of the circuit breaker 110 and the plurality of diagnostic devices 120 for monitoring load currents on the branch circuit 10 (or sections thereof) under different power supply and load connection scenarios; to receive diagnostic information from the circuit breaker 110 and the plurality of the diagnostic devices 120, where the received diagnostic information can include information corresponding to the monitored load currents on the branch circuit (or sections thereof); and to determine a mapping of the outlet locations 12 along the branch circuit 10 based on the received diagnostic information, a type and location of a fault on the branch circuit based on the received diagnostic information, or other conditions on the circuit based on the diagnostic information. The diagnostic information can correspond to the monitored currents (e.g., current on the L, N and G lines) on the branch circuit 10 or sections thereof, such as the amount of current sensed or measured by sensors or calculated or derived based on the measurements by the sensors. The sensors can reside in the diagnostic devices and, if desired, also in the circuit breaker. The smart device 130 can perform wireless or wireline communication with the circuit breaker(s) 110, the diagnostic devices 120, or other device, via the communication device, over a network such as a star or mesh network or other communication network.

Depending on the type of circuit diagnostics to be performed (e.g., outlet mapping, fault detection, etc.), the smart device 130 can control the components of the diagnostic devices 120 and the circuit breaker 110 to implement different power supply and load connection scenarios at different/varying voltage/current levels, in order to gather sufficient diagnostic information for different sections of the branch circuit 10 to perform the circuit diagnostics. For example, the smart device 130 can have the diagnostic devices 120 utilize a low voltage supply when performing diagnostics for outlet mapping and series and ground fault detection, and utilize high (or higher) voltage supply when performing diagnostics for parallel fault detection.

The smart device 130 can also be configured to receive settings and parameters from a user for implementing the circuit diagnostic process or method. The settings and parameters can include, among other things, the assignment of a different (or unique) identifier for each of the installed diagnostic devices 120 and the circuit breaker(s) 110, the assignment of a different load level for each of the loads of the installed diagnostic devices 120 and the circuit breaker (s) 110, the selection of types of fault(s) to search or identify (e.g., ground fault, arc fault, parallel arc fault, series arc fault, or other known types of electrical faults), and the assignment of voltage or current level(s) at which power is to be supplied by each of the installed diagnostic devices 120 for particular operations (such as when performing outlet mapping, fault detection, fault location detection, etc.). The smart device 130 may also receive other settings/parameters, such as the identity of the outlet location, if already known, such as for example the outlet location at the end of the branch circuit 10, which can be identified during the installation of the diagnostic devices 120 to the outlet locations 12, or other information which may assist with the circuit diagnostics. The smart device 130 can provide a user interface (e.g., graphical user interface (GUI)) for enabling a user to input or select the settings and parameters, for selecting diagnostic devices to control and coordinate, for outputting information to the user (e.g., reports, alarm, detected type of fault and location, outlet mapping, load values, voltage/current values, etc.), and for performing other interactions between the user and the smart device 130 as well as the circuit breaker 110 and the diagnostic devices 120.

Figure 2:
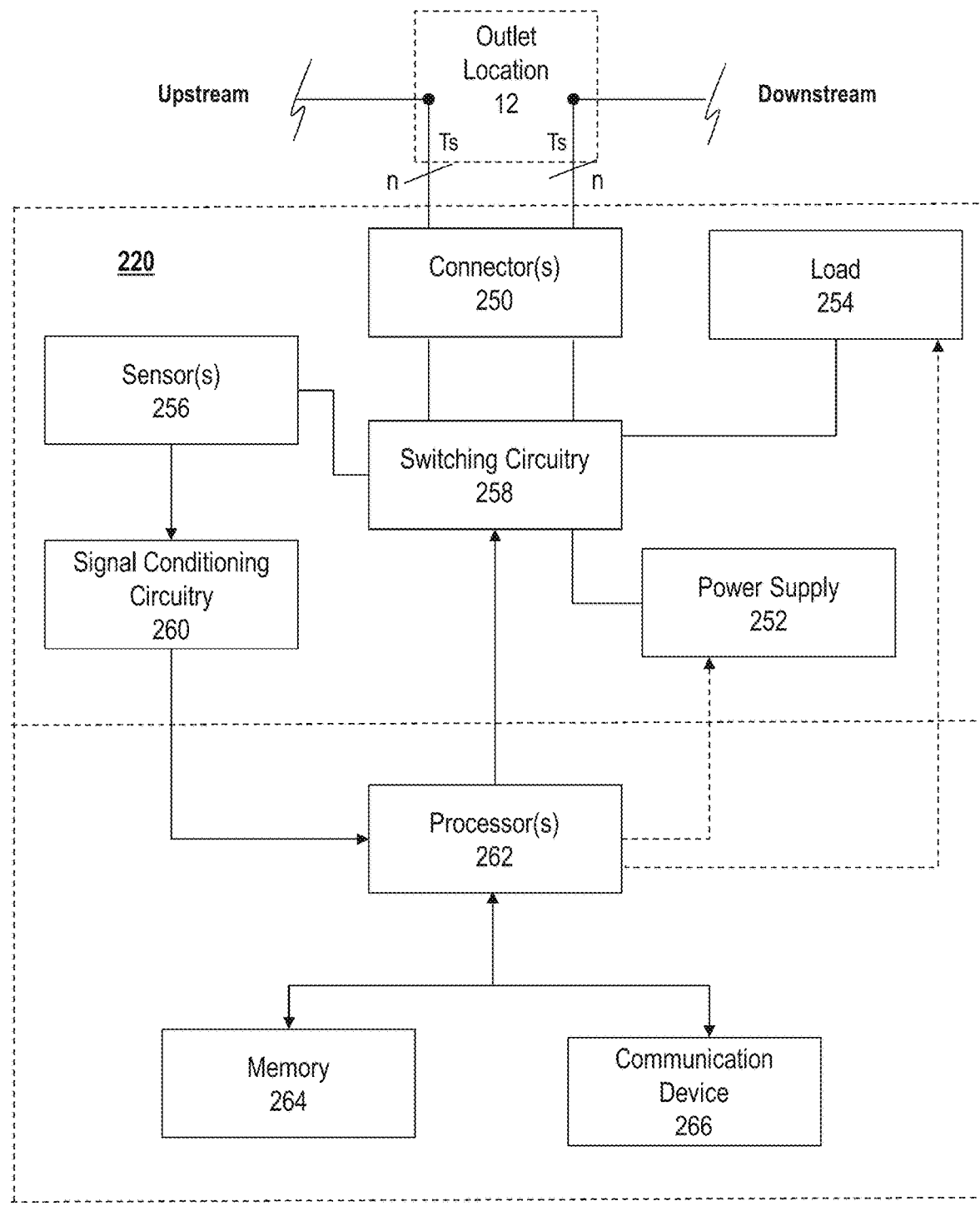
FIG. 2 shows a diagram of example components of a diagnostic device of the system of FIG. 1, in accordance with an embodiment.

FIG. 2 illustrates example components of a diagnostic device 220, which can be one example of the diagnostic device 120 of FIG. 1. As shown in FIG. 2, the diagnostic device 220 can include electrical connectors 250, power supply 252, load 254, sensor(s) 256, switching circuitry 258, signal-conditioning circuitry 260, processor(s) 262, memory 264, and communication device(s) 266. The diagnostic device 220 can also include protection circuitry to handle situations when two power supplies of two diagnostic devices are connected together or if the circuit breaker is closed thereby energizing the branch wiring.

The electrical connectors 250 can include a plurality of terminals or leads (generally referred to as "terminals") Ts for connecting to branch circuit wiring, such as at an outlet location. The plurality of terminals Ts can include a first set of terminals for connecting to the section (or portion) of the branch circuit which is upstream from the outlet location, and a second set of terminals for connecting to a section of the branch circuit which is downstream from the outlet location. The terminals Ts of the electrical connectors 250 can take the form of a lead, or various electrical wire fasteners or connectors (e.g., clamps, clips, etc.) for detachably connecting branch circuit wiring (e.g., L, N, G and other conductors), and can include suitable electrical insulators/insulation to electrically separate and isolate the different lines connected to the electrical connectors 250 and to prevent the exposure of the conductors when the terminals Ts are connected to the circuit wiring.

The power supply 252 can be a variable power supply. The power supply 252 can be employed to supply power (e.g., voltage/current) to the branch circuit or a desired upstream or downstream section thereof, or to provide for back feeding circuit breaker (e.g., 110) and potential hazardous fault. The power supply 252 can include a battery, an isolated AC or DC supply or other power source, which is independent of the main power supply for the branch circuit. The power supply 252 can provide for touch safe voltage levels (e.g., 12V, 24 C, or <40 V, etc.). In various embodiments, the power supply 252 can output voltages at different voltage levels, which can and cannot energize an arc fault. The power supplied also can be current limited to prevent potential hazardous arc fault from reaching hazardous levels by adjusting the voltage and/or load level on the circuit or circuit section to be monitored. The load 254 can include a variable load or a plurality of selectable loads having different load levels.

The sensor(s) 256 can sense and measure electrical characteristics (e.g., voltage, current, etc.) on the conductors of the branch circuit or section(s) thereof or electrical components connected thereto for monitoring currents on the branch circuit, such as load currents when a load(s) is connected to the branch circuit or section thereof. The load currents can be sensed or measured by the sensor(s), or calculated or derived from sensor measurements taken from the sensor(s) 256. The sensor(s) 256 can include current sensor(s), voltage sensor(s) or other types of sensors, which can sense electrical characteristics on conductors of the branch circuit or section(s) thereof for use in sensing, measuring, calculating or deriving the currents on the monitored circuit or circuit section. As previously discussed, the monitored currents can include the current on the conductors of the L, N and G lines of the monitored circuit. The signal-conditioning circuitry 260 can condition the output signals from the sensors 256, and can include, for example, amplifier(s), filter(s) and other signal conditioning components.

The switching circuitry 258 can be connected to the components of the diagnostic device, including the electrical connectors 250, the power supply 252, the load 254 and the sensor(s) 256. The switching circuitry 258 can include a plurality of switches for electrically isolating sections of the branch circuit, which are upstream and downstream from the electrical outlet location. The switching circuitry 258 can also be operated to selectively connect or disconnect components of the diagnostic device 220 to and from each other, respectively. For example, the switching circuitry 258 is operable to selectively connect or disconnect the power supply 252 or the load 254 to or from, respectively, either the upstream or downstream section of the branch circuit from the outlet location. The switching circuitry 258 can reverse the branch circuit connections to connect the power supply to the upstream section and the load to the downstream section, or vice-a-versa.

In various embodiments, the switching circuitry can also be configured to electrically connect the upstream and downstream sections of the branch circuit at the outlet location. With this additional switching mode, the diagnostic devices 220 can implement a pre-diagnostic process to identify the branch direction connection for each set of terminals of the electrical connector 250. For example, each diagnostic device 220 can isolate its upstream and downstream sections, connect the power supply 252 to one isolated section and monitor the load currents, and then connect the power supply 252 to the other isolated section and monitor the load currents, while the other diagnostic devices 220 have their associated upstream and downstream sections electrically connected and the circuit breaker has its load connected to the branch circuit. In this way, each diagnostic device 220 can identify the set of terminals Ts, which are connected to the upstream circuit breaker, based on the monitored load. This additional switching mode can also provide for additional power supply and load connection scenarios for monitoring conditions on the circuit. Furthermore, in various embodiments, the diagnostic device 220 can also incorporate the functionality of an electrical outlet.

The processor(s) 262 is configured to control and coordinate the operations of the diagnostic device 220 and its components. These operations can include but is not limited to: controlling connections of components of the diagnostic device 220 to each other and/or to the upstream or downstream section of the branch circuit from the outlet location via the switching circuitry 258; controlling connection or disconnection of the upstream and downstream sections to or from each other, respectively; controlling the level of power, such as voltage or current level, supplied via the power supply 252; controlling the level of a load to be connected to the branch circuit via the load 254; controlling communication of information or other data (including diagnostic information) to a remote device(s) via the communication device 266; and/or performing other operations including control and diagnostic operations described herein. The communication device(s) 266 can be configured to perform wireless or wireline communication with one or more remote devices.

The memory 264 can store computer executable code, programs, software or instructions, which when executed by a processor(s), controls the operations of the diagnostic device 220, including the various methods/processes described herein. The memory 264 can also store other data used by the diagnostic device 220 or components thereof to perform the operations described herein.

Figure 3:
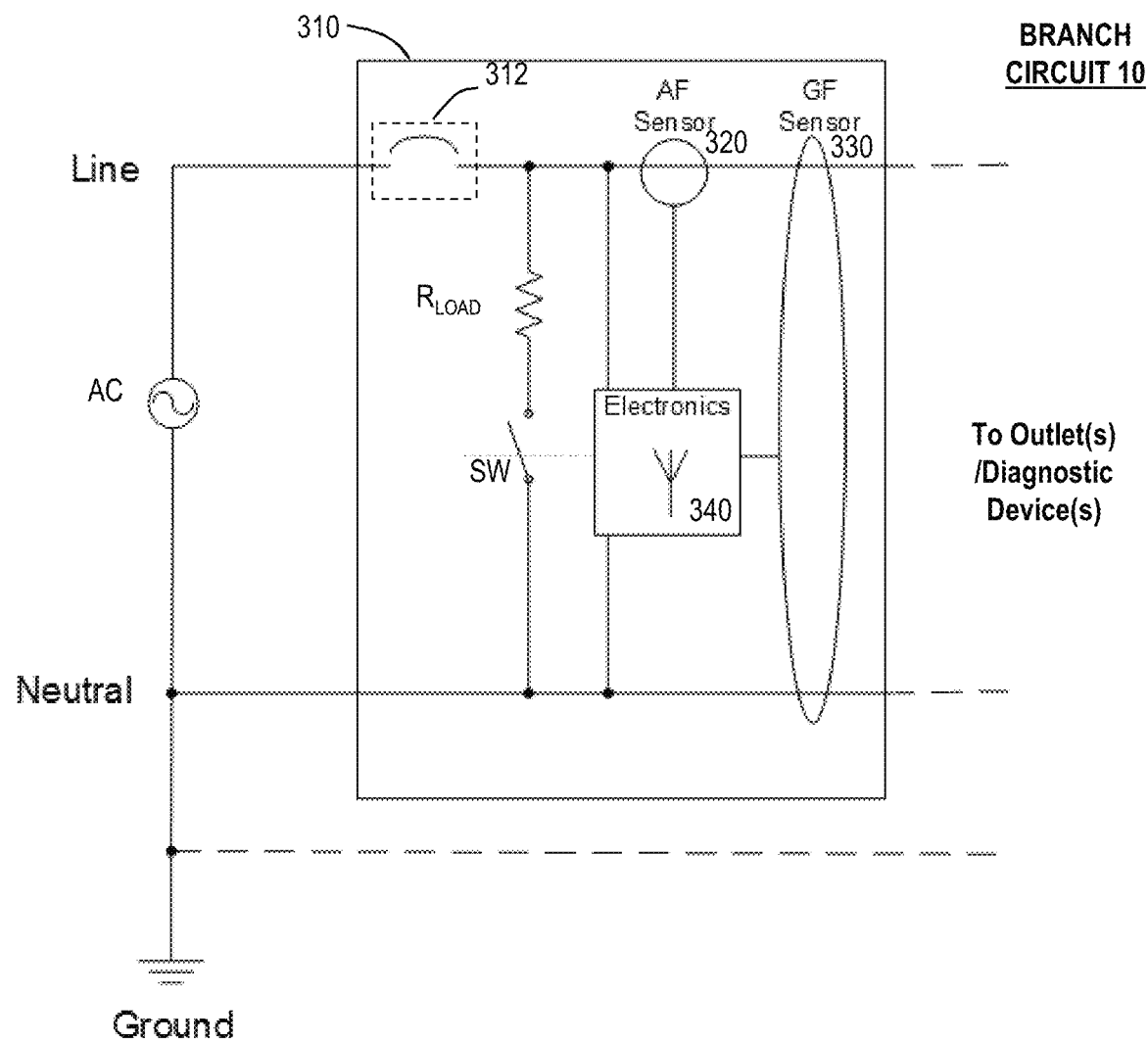
FIG. 3 shows a circuit diagram of example components of a circuit breaker of the system of FIG. 1, in accordance with an embodiment.

FIG. 3 shows a circuit diagram of example components of a circuit breaker 310, such as a smart breaker, connected to the branch circuit 10, in accordance with an embodiment. The circuit breaker 310 can be an example of the circuit breaker 110 of FIG. 1. As shown in FIG. 3, the circuit breaker 310 can include a trip/switch unit 312, a load (RLoad), sensors including an arc fault sensor 320 and a ground fault sensor 330, and other electronics 340. The arc fault sensor 320 is configured to detect an arc fault on the branch circuit 10, and the ground fault sensor 330 is configured to detect a ground fault on the branch circuit 10. The trip/switch unit 312 is configured to interrupt power (e.g., from the AC power source) to the branch circuit 10 when a fault or other hazardous conditions are detected, or to enable power to be turned on or off to the branch circuit from the mains/upstream supply. The load (RLoad) can be selectively connected to or disconnected from the branch circuit 10, via the switch SW, such as when the branch circuit 10 is isolated from the mains supply or upstream power supplying circuit (e.g., when the circuit breaker is off or is tripped). The electronics 340 can include a processor(s) for controlling the operations of the circuit breaker 310 and its components, memory, and a communication device for performing wireless or wireline communication with one or more remote devices, over a network.

Figure 4:
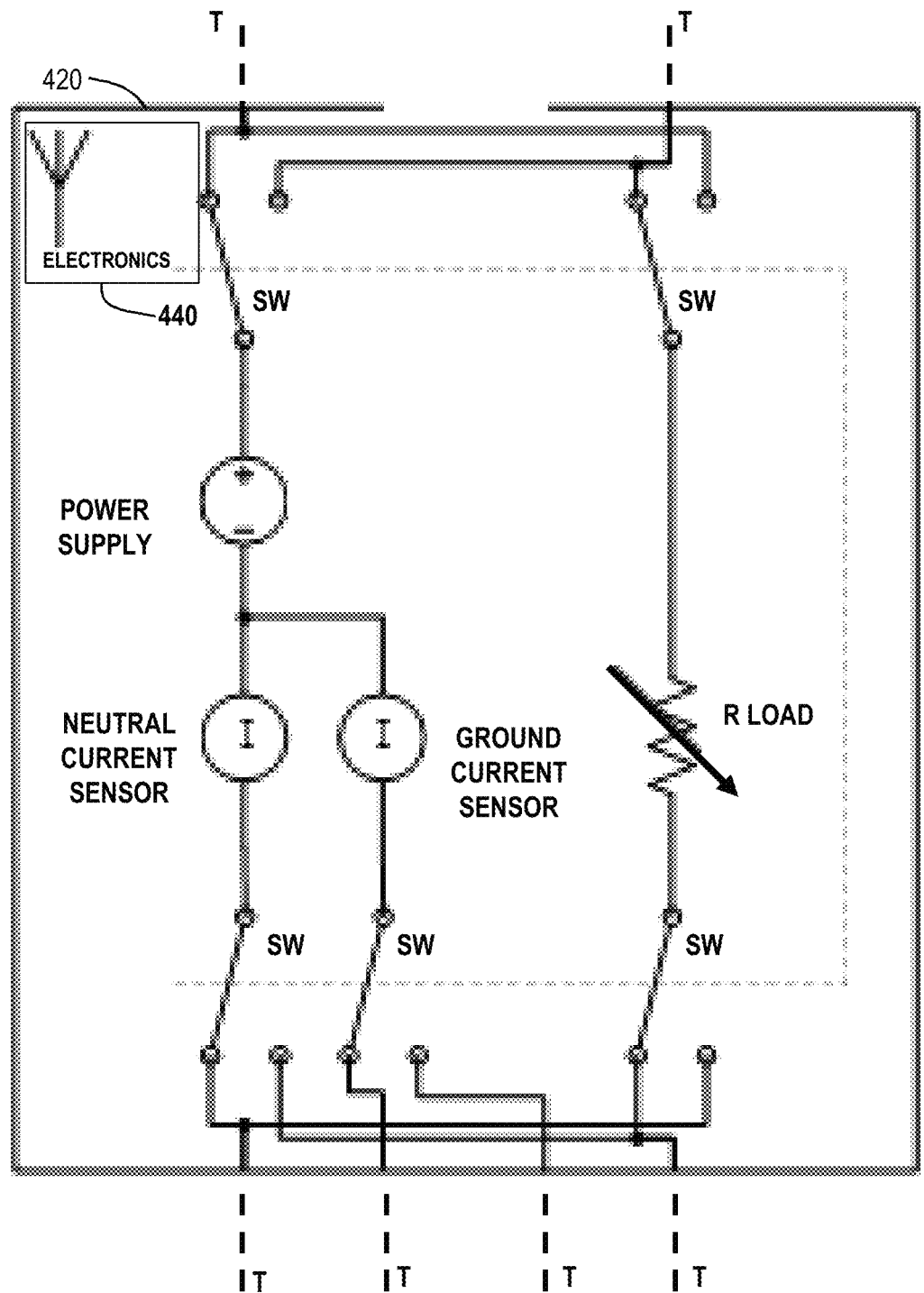
FIG. 4 shows a circuit diagram of example components of a diagnostic device of the system of FIG. 1, in accordance with an embodiment.

FIG. 4 shows a circuit diagram of example components of a diagnostic device 420, which can be an example of the diagnostic devices 120 or 220 of FIGS. 1 and 2. In the example of FIG. 4, the diagnostic device 220 can include electrical connectors, a power supply, a load (RLoad), sensor(s), switching circuitry, and electronics 440. The electronics 440 can include processor(s), memory, and communication device(s).

The electrical connectors can include a plurality of terminals Ts for connecting to branch circuit wiring, such as at an electrical outlet location. The plurality of terminals can include a first set of terminals for connecting to the section of the branch circuit which is upstream from the outlet location, and a second set of terminals for connecting to a section of a branch circuit which is downstream from the outlet location. The terminals Ts of the electrical connectors can take the form of a lead, or various electrical wire fasteners or connectors (e.g., clamps, clips, etc.) for connecting branch circuit wiring (e.g., L, N, G and other lines), and can include suitable electrical insulators/insulation to electrically separate or isolate the different lines connected to the electrical connectors and to prevent the exposure of the conductors when the terminals are connected to the circuit wiring.

The power supply can be a fixed or variable power supply. The power supply can be employed to supply power (e.g., voltage/current) to the branch circuit or a desired upstream or downstream section thereof, or to provide for back feeding a circuit breaker (e.g., 110) and potential hazardous fault. In this example, the power supply can be a variable DC or AC supply, and can be configured to provide voltage at touch-safe levels.

The load (Rload) can include a variable load or a plurality of selectable loads each having a different load level (referred herein as a "variable load").

The sensor(s) can sense and measure electrical characteristics (e.g., voltage, current, etc.) on the conductors of the branch circuit (or section(s) thereof) or electrical components connected thereto for monitoring currents on the branch circuit, such as load currents when a load(s) is connected to the branch circuit. The load currents can be sensed or measured by the sensor(s), or calculated or derived from sensor measurements taken by the sensor(s). As previously discussed, the currents can include the current on L, N and G lines on the branch circuit. In this example, the sensor(s) include a neutral current sensor for monitoring current on the neutral line (N) and a ground current sensor for monitoring current on the ground line (G). The current on the power line (L) can be derived from the neutral current and ground current, which together should equal the current on the power line on normal conditions. The current on the power line (L) can also be monitored by measuring the current across a load (e.g., Rload) on the circuit or with a power line sensor.

The switching circuitry is connected to the components of the diagnostic device 420, which can include the electrical connectors, the DC supply, the load Rload and the neutral and ground current sensors. In this example, the switching circuitry includes a plurality of switches SWs for selectively isolating the upstream and downstream sections of the branch circuit from the outlet location, and selectively connecting or disconnecting components of the diagnostic device 420 to and from each other, respectively. For example, the switches SWs of the switching circuitry are operable to isolate the upstream and downstream section of the branch circuit from the outlet location, and to connect or disconnect the DC supply or the load Rload to or from, respectively, either the upstream or downstream section of the branch circuit from a connected outlet location. In this example, the switches SWs of the switching circuitry can be operated to connect the DC supply to one of the upstream and downstream section of the branch circuit from the outlet location and, at the same time, connect the load RLOAD to the other one of the upstream and downstream portion of the branch circuit from the outlet location. The switching circuitry can be operated to reverse the branch circuit connections.

The processor(s) of electronics 440 is configured to control the operations of the diagnostic device 420 and its components. These operations can include but is not limited to: controlling connections of components of the diagnostic device 420 to each other and/or to the upstream or downstream section of the branch circuit 10 from the outlet location via the switches SWs of the switching circuitry; controlling the switches SW to isolate the upstream and downstream sections of the branch circuit from each other; controlling the level of power supplied via the DC supply; controlling the level of load to be connected to the branch circuit via the load RLOAD; controlling communication of information or other data (including diagnostic information) to a remote device(s) via the communication device; or performing other operations including control operations described herein. The communication device(s) of electronics 440 is configured to perform wireless or wireline communication with one or more remote devices, over a network.

The memory of electronics 440 can store computer executable code, programs, software or instructions, which when executed by a processor(s), controls the operations of the diagnostic device 420, including the various methods/processes described herein. The memory can also store other data used by the diagnostic device 420 or components thereof to perform the operations described herein.

Figure 5:
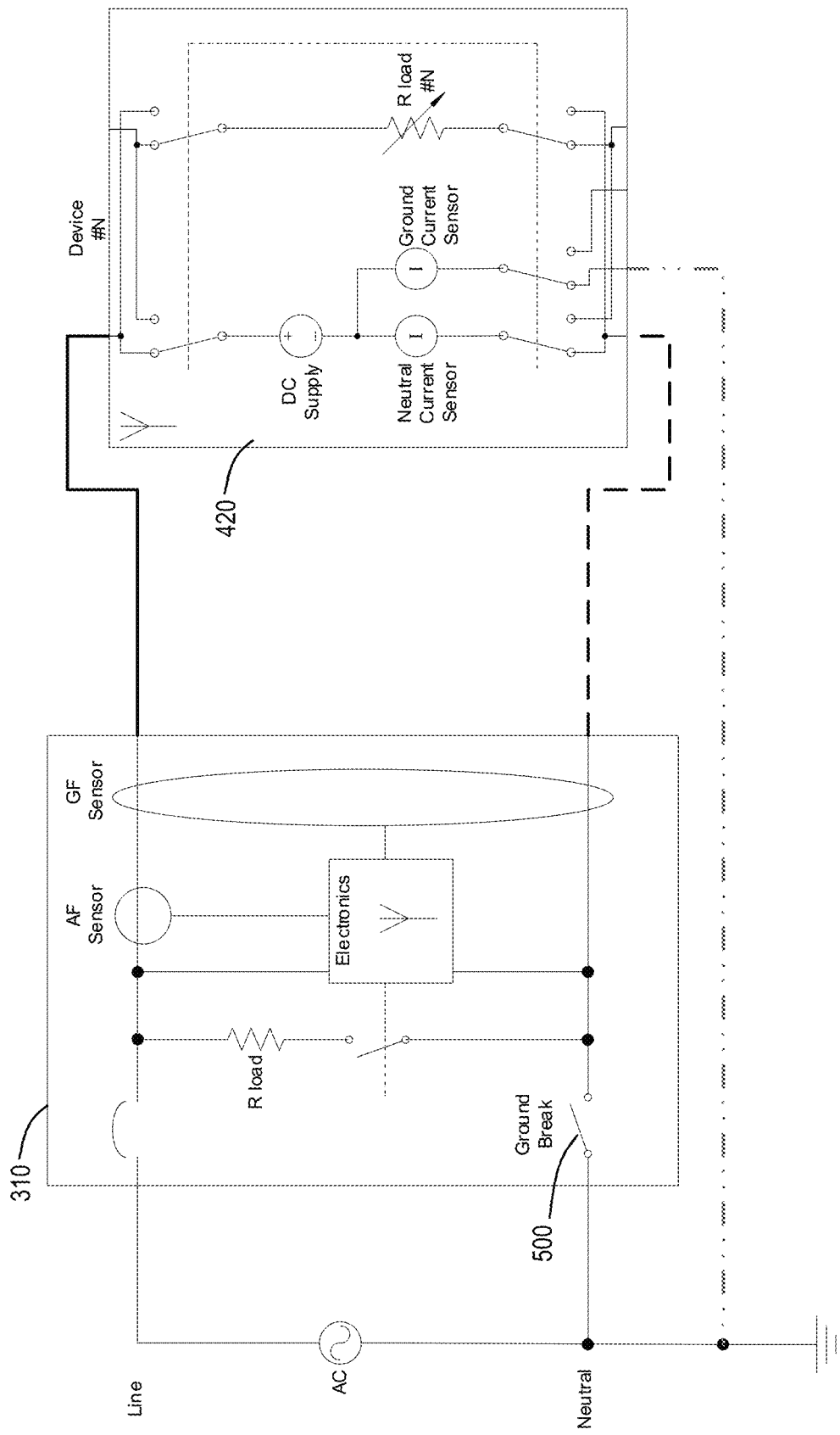
FIG. 5 shows a circuit diagram of the circuit breaker and a diagnostic device(s) of FIGS. 3 and 4 connected on a branch circuit, in accordance with an embodiment.
Figure 6:
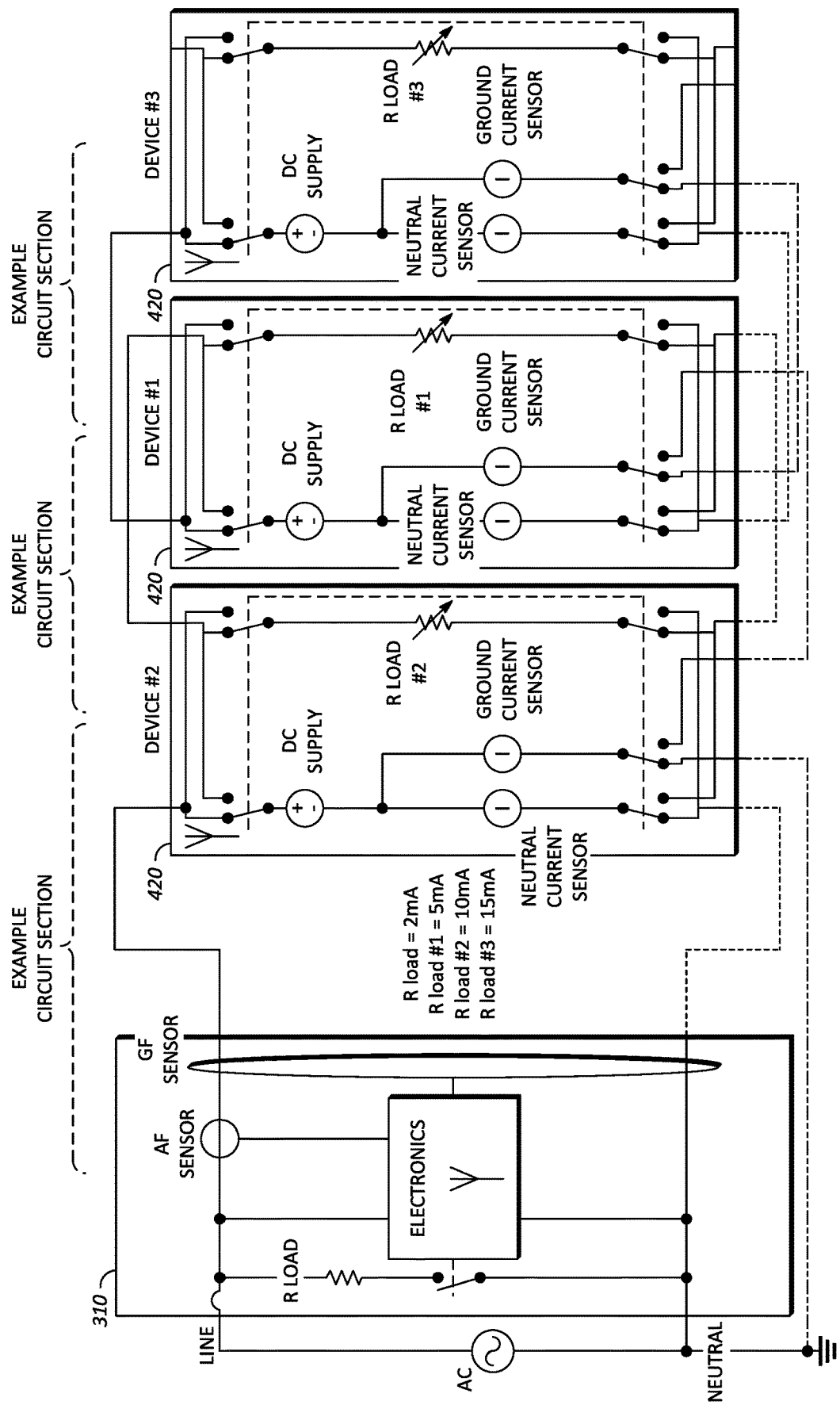
FIG. 6 shows an example circuit of the circuit breaker and three diagnostic devices, such as of FIGS. 3 and 4, which are connected on a branch circuit, in accordance with an embodiment.
Figure 7:
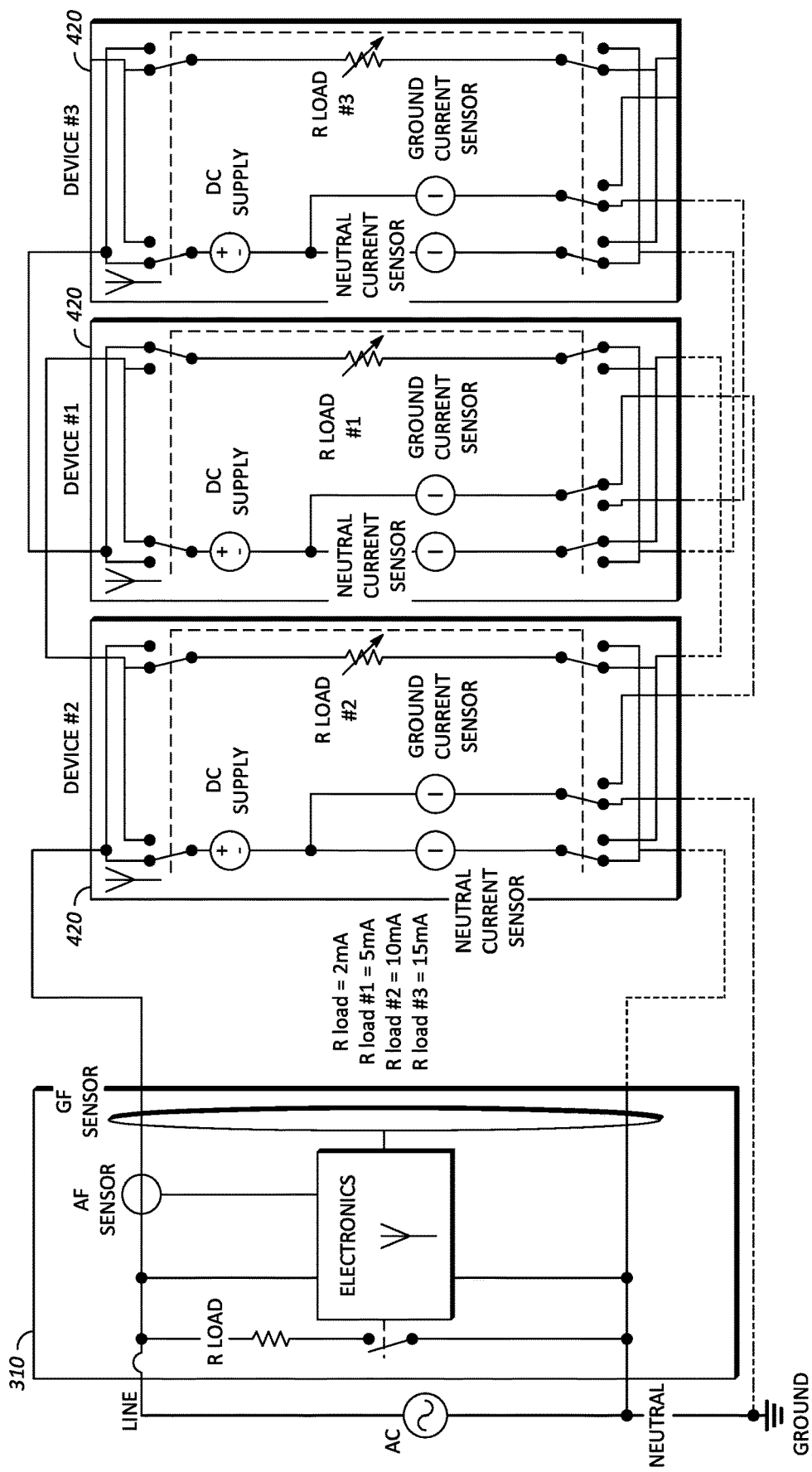
FIG. 7 shows the example circuit of FIG. 6 in which the switches of the switching circuitry of one of the three diagnostic devices has its branch connections reversed, in accordance with an embodiment.

FIG. 5 shows a circuit diagram of the circuit breaker 310 of FIG. 3 and one diagnostic device 420 of FIG. 4 connected at an outlet location along a branch circuit 10. As shown in FIG. 5, terminals Ts of the diagnostic device 420 are connected to the branch wirings, e.g., L, N and G lines, in the upstream direction. FIGS. 6 and 7 show another circuit example in which the circuit breaker 310 of FIG. 3 and three diagnostic devices 420 (e.g., Device #1, Device #2 and Device #3) are connected to the branch circuit at different outlet locations along the branch circuit 10. In this example, the three diagnostic devices 420 are connected at different outlet locations along the branch circuit in the order, as follows: Device #2 (closest to circuit breaker), Device #1 and finally Device #3. In FIG. 6, the switches SWs of the switching circuitry of the diagnostic device "Device #2" are operated so that the DC supply is connected to the upstream direction of the section of branch circuit from the outlet location, and the load is connected to the downstream direction of the section of the branch circuit from the outlet location. In FIG. 7, the switching circuitry of the diagnostic device "Device #1" is operated to reverse the branch connection so that the DC supply is connected to the downstream section, and the load is connected to the upstream section.

Various example diagnostic operations will be described below with reference to the circuit configuration of FIGS. 6 and 7, with the circuit breaker 310 and three diagnostic devices 420 (e.g., Device #1, Device #2 and Device #3) connected to outlet locations along the branch circuit 10. For the purposes of explanation, in this example, when a known voltage (e.g., Low voltage or High voltage) is supplied by the DC supply individually to each known load of the circuit breaker 310 and the three diagnostic devices 420 connectable to the branch circuit 10, the resulting current across the loads under normal circuit conditions are as follows: R load (Circuit breaker)/2 mA, R load (Device #1)/5 mA, R load (Device #2)/10 mA and R load (Device #3)/15 mA. In this way, it is possible to identify a location of the diagnostic devices and their associated outlet location (and other information about the conditions on the circuit) when sufficient diagnostic information about the load currents across different sections of the branch circuit is monitored and gathered through the operation of the diagnostic devices 420.

An example diagnostic process implementation for mapping outlet/outlet locations is described in Table 1, which is provided below.

TABLE 1

| Round | Location | Monitored Current | Voltage Level Supplied | Conclusion | Action |
|---|---|---|---|---|---|
| 1 | Device #1 | 0 mA | Low | Unknown | Change Connection |
|  | Device #2 | 2 mA | Low | 1$^{st}$ Outlet Location | None |
|  | Device #3 | 0 mA | Low | Unknown | None |
| 2 | Device #1 | 10 mA | Low | Downstream of Device #2 |  |
|  | Device #2 | 2 mA | Low | 1$^{st}$ Outlet Location |  |
|  | Device #3 | 5 mA | Low | End Outlet Location, Downstream of Device #2 |  |

As shown in Table 1 above, in Round 1 using the circuit configuration in FIG. 6, the Device #1 detects a load current on the power line (L) of 0 mA on a monitored circuit section, the Device #2 detects a load current on the power line (L) of 2 mA on a monitored circuit section, and the Device #3 detects a load current on the power line (L) of 0 mA on a monitored circuit section. Based on this information, it is concluded that the Device #2 is in the first (1') outlet location (or the outlet location with an installed diagnostic device which is closest to the circuit breaker) since the current monitored by Device #2 matches that for the circuit breaker 310. The diagnostic information gathered by Devices #1 and #3 are inconclusive.

In Round 2, the power supply and load connections are changed to the circuit configuration in FIG. 7. In this example, the branch connection for Device #1 is reversed. The Device #1 now detects a load current on the power line (L) of 10 mA on a monitored circuit section, the Device #2 detects a load current on the power line (L) of 2 mA on a monitored circuit section, and the Device #3 detects a load current on the power line (L) of 5 mA on a monitored circuit section. Based on this additional diagnostic information (along with the prior conclusion that Device #1 is in the first outlet location), it is further concluded that Device #1 is downstream of Device #2 since the current monitored by Device #1 matches that for Device #1, and Device #3 is the end outlet location and downstream of Device #1 since the current monitored by Device #3 matches that for Device #1. The location of the last outlet location and Device #3 may also have been known beforehand during installation of the Device #3 to the end/terminating wiring of the branch circuit. Accordingly, the outlet locations of the circuit mapping from the circuit breaker is Device #2, Device #1 and finally Device #3, based on the gathered diagnostic information of the monitored load currents across different sections of the branch circuit.

Figure 8:
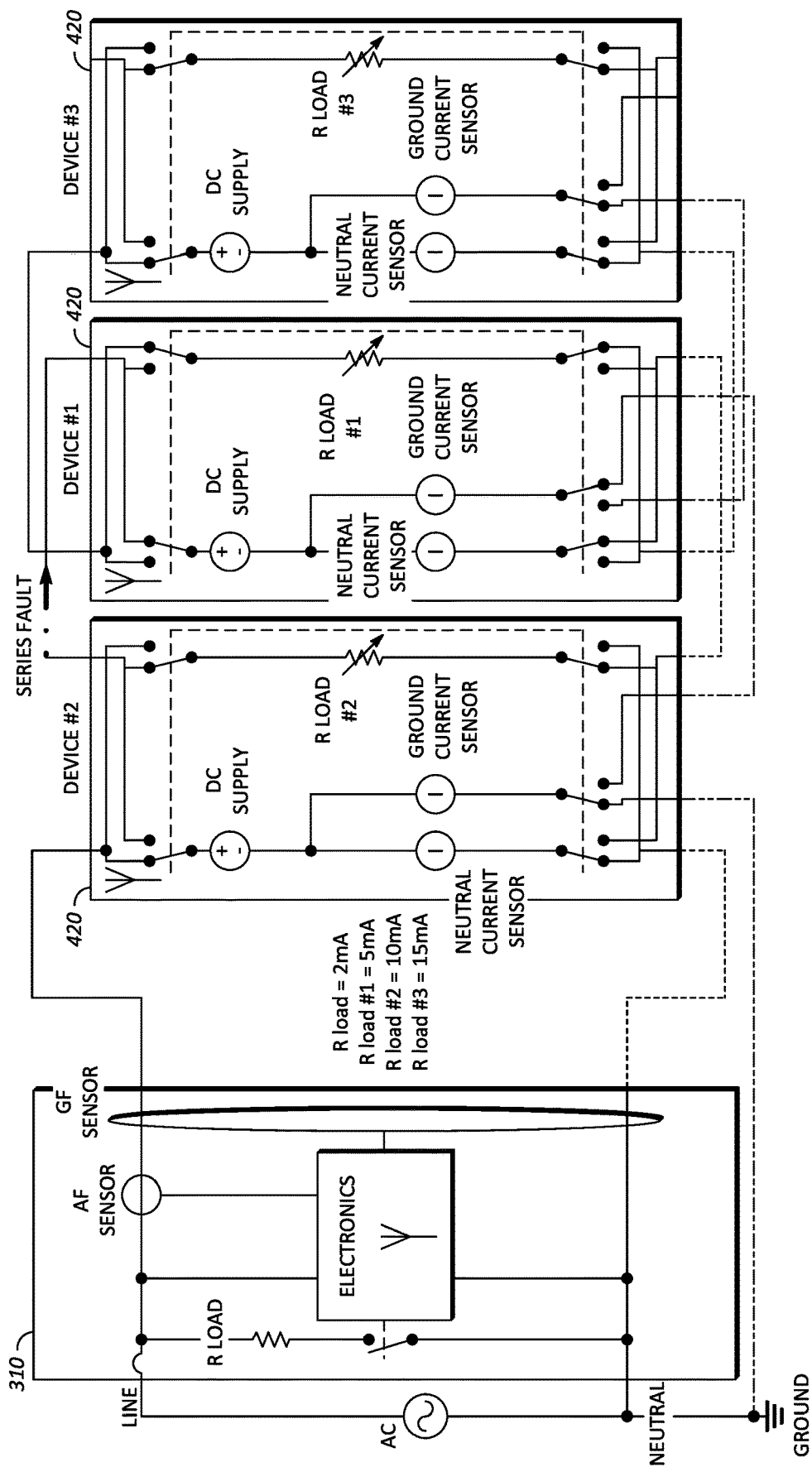
FIG. 8 shows the example circuit of FIG. 7 in which a series fault is detected between the first and second diagnostic devices, which are connected along the branch circuit, in accordance with an embodiment.

FIG. 8 shows the example circuit of FIG. 7 in which a series fault is detected between diagnostic devices 420, e.g., Device #1 and Device #2, in accordance with an embodiment. An example diagnostic process implementation for detection of a series fault on the circuit is described in Table 2, which is provided below.

TABLE 2

| Round | Location | Monitored Current | Voltage Level Supplied | Conclusion | Action |
|---|---|---|---|---|---|
| 1 | Device #1 | 0 mA | Low | Unknown | Change Connection |
|  | Device #2 | 2 mA | Low | 1$^{st}$ Outlet Location | None |
|  | Device #3 | 0 mA | Low | Unknown | None |
| 2 | Device #1 | 0 mA | Low | Upstream of Device #3; assumes downstream of Device #2 with series fault |  |
|  | Device #2 | 2 mA | Low | 1st Outlet Location |  |
|  | Device #3 | 5 mA | Low | End Outlet Location, Downstream of Device #2 |  |

As described in Table 2 above, in Round 1 using the circuit configuration in FIG. 6, the Device #1 detects a load current on the power line (L) of 0 mA on a monitored circuit section, the Device #2 detects a load current on the power line (L) of 2 mA on a monitored circuit section, and the Device #3 detects a load current on the power line (L) of 0 mA on a monitored circuit section. Based on this information, it is concluded that the Device #2 is in the 1$^{st}$ outlet location (or the outlet location with an installed diagnostic device which is closest to the circuit breaker 310) since the current monitored by Device #2 matches that for the circuit breaker. The diagnostic information gathered by Devices #1 and #3 are inconclusive.

In Round 2, the power supply and load connection are changed to the circuit configuration shown in FIGS. 7 and 8. In this example, the branch connection for device #1 is reversed. The Device #1 now detects a load current on the power line (L) of 0 mA on a monitored circuit section, the Device #2 detects a load current on the power line (L) of 2 mA on a monitored circuit section, and the Device #3 detects a load current on the power line (L) of 5 mA on a monitored circuit section. Based on this additional diagnostic information (along with the prior conclusion that Device #1 is in the first outlet location and knowledge that Device #3 is the end outlet location), it can be further concluded that Device #3 is downstream of Device #1 since the current monitored by Device #3 matches that for Device #1, and thus, Device #1 is downstream of Device #2. The end outlet location may be provided by a user, when the diagnostic devices are installed in the end outlet location (e.g., terminating branch wiring). Accordingly, the outlet locations of the circuit mapping from the circuit breaker is Device #2, Device #1 and finally Device #3, based on the gathered diagnostic information of the monitored load currents across different sections of the branch circuit. Furthermore, it is further concluded that there is a series fault between Device #1 and Device #2 as shown in FIG. 8, since the monitored current of the circuit section between these two devices is unknown (e.g., 0 mA) from both directions.

Figure 9:
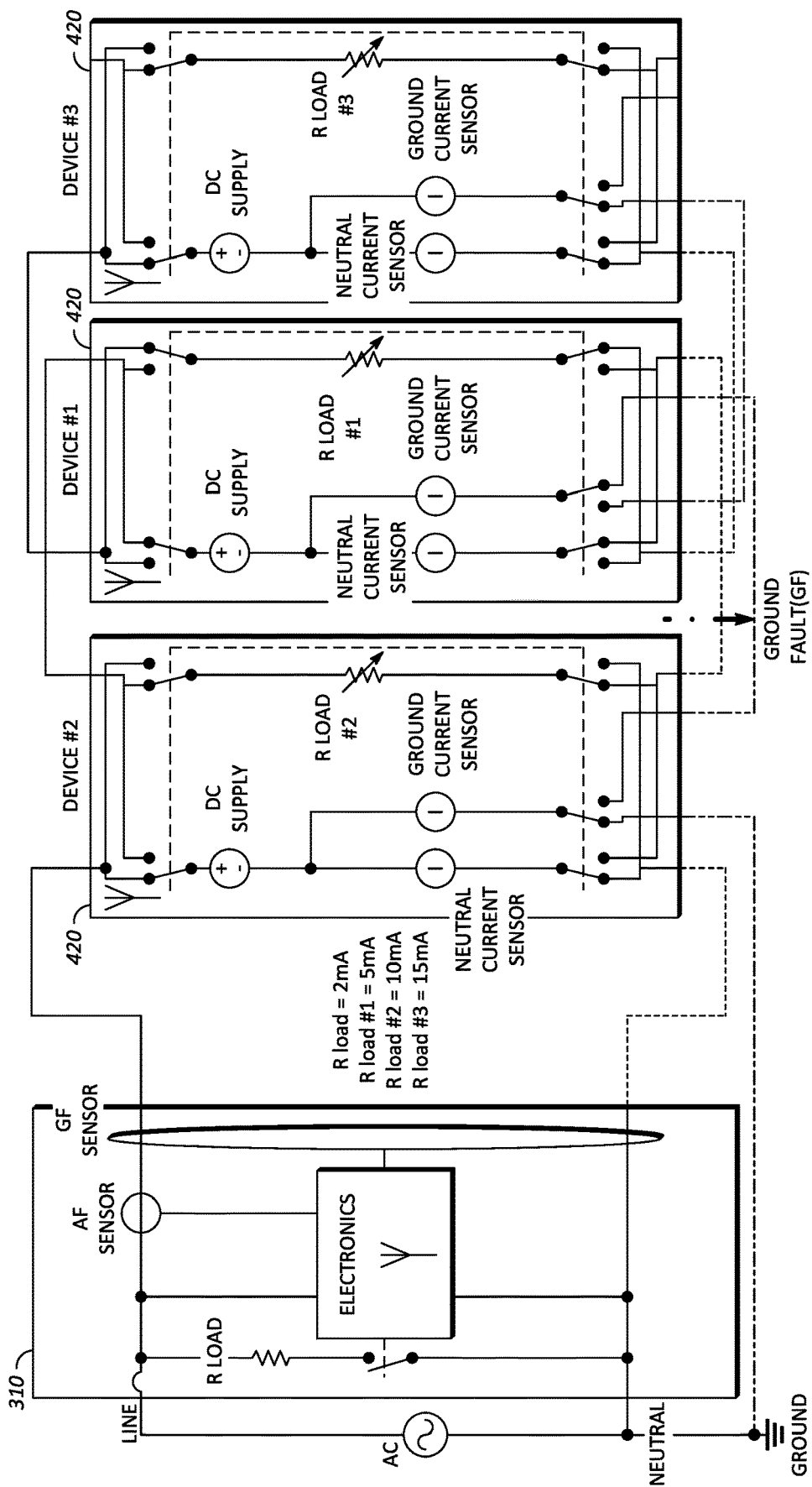
FIG. 9 shows the example circuit of FIG. 7 in which a ground fault is detected between the first and second diagnostic devices, which are connected along the branch circuit, in accordance with an embodiment.

FIG. 9 shows the example circuit of FIG. 7 in which a ground fault is detected between diagnostic devices 420, e.g., Devices #1 and #2, in accordance with an embodiment. The diagnostic process for detecting an existence of potential ground fault(s) and its location can entail the circuit mapping process previously described herein, which is then followed by an evaluation of the load current for the ground line (or earth ground) for different circuit sections of the branch circuit. An example diagnostic process implementation for detection of a ground fault on the circuit configuration of FIGS. 7 and 9 is described with reference to Table 3, which is provided below.

TABLE 3

| Location | Voltage Level | Load Current on L | Load Current on N | Load Current on G | Conclusion |
|---|---|---|---|---|---|
| Device #1 | Low | 10 mA | 7 mA | 3 mA | Ground fault (GF) between Device #1 and Device #2 |
| Device #2 | Low | 2 mA | 2 mA | 0 mA | No GF |
| Device #3 | Low | 5 mA | 5 mA | 0 mA | No GF |

Table 3 describes an example ground fault (GF) detection analysis performed after a circuit mapping process. As shown in Table 3 above, the monitored load currents on Device #1 for L is 10 mA, N is 7 mA and G is 3 mA; the monitored load currents on Device #2 for L is 2 mA, N is 2 mA and G is 0 mA; and the monitored load currents on Device #3 for L is 5 mA, N is 5 mA and G is 0 mA. Based on this diagnostic information, it can be concluded that there is a ground fault between Device #1 and Device #2 as shown in FIG. 9 since the monitored current on G (or earth ground) by Device #1 is 3 mA or not (or greater than) zero. There is no ground fault on the section of the branch circuit between the circuit breaker 310 and Device #2 and the section of the branch circuit between Device #1 and Device #3 since the monitored ground current in both of these sections is zero.

Figure 10:
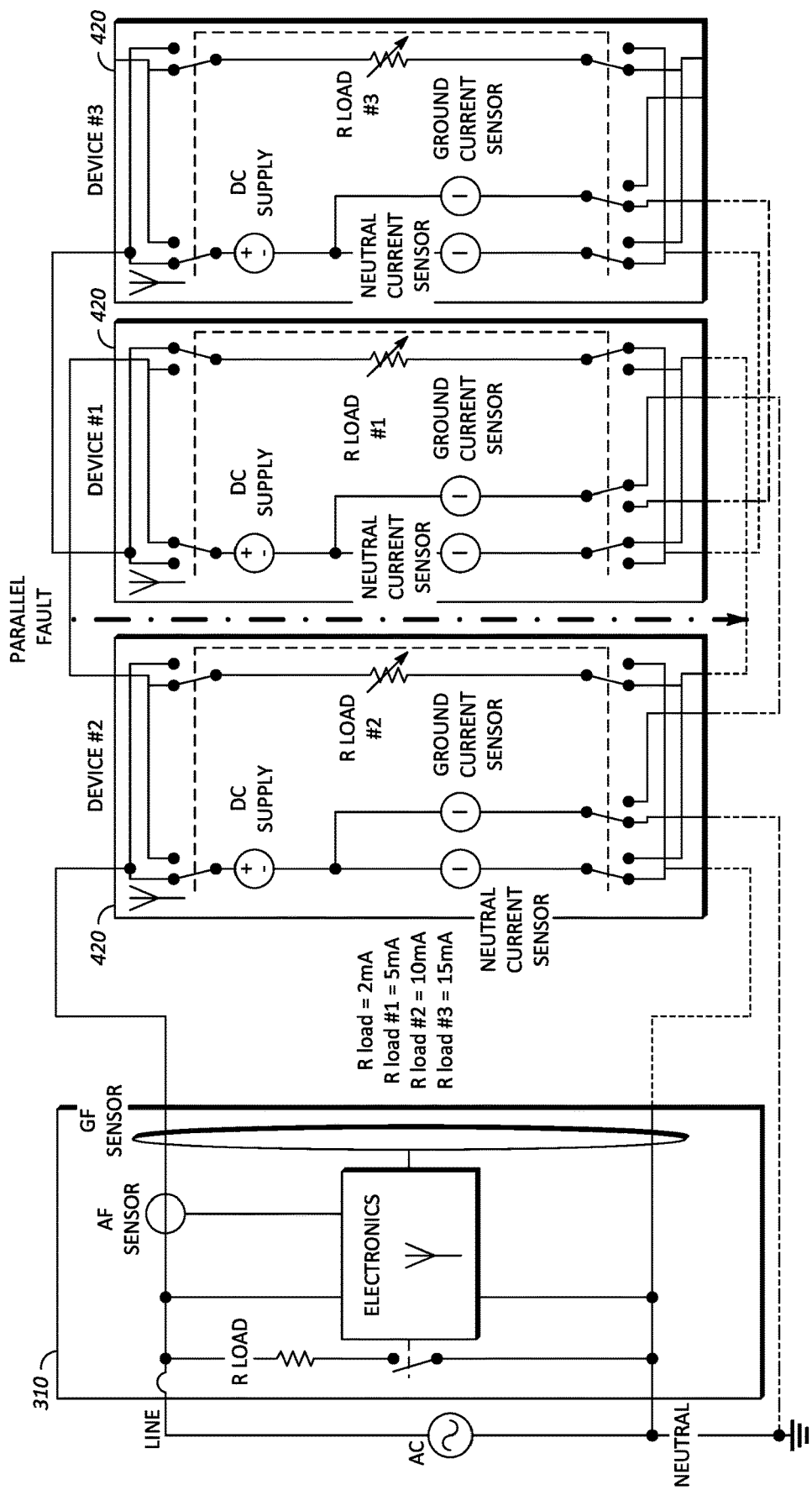
FIG. 10 shows the example circuit of FIG. 7 in which a parallel line-to-neutral fault is detected between the first and second diagnostic devices, which are connected along the branch circuit, in accordance with an embodiment.
Figure 11:
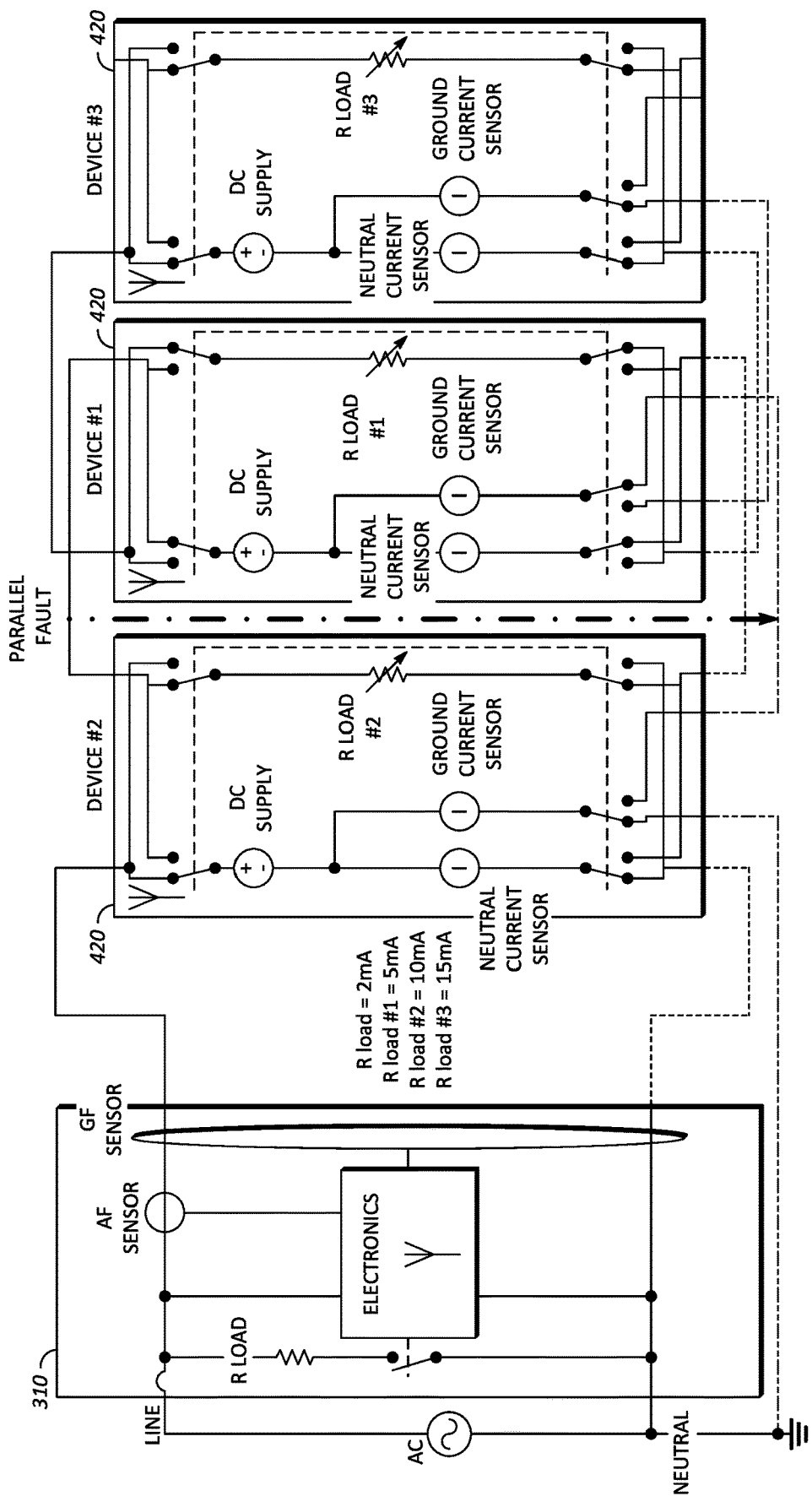
FIG. 11 shows the example circuit of FIG. 7 in which a parallel line-to-ground fault is between the first and second diagnostic devices, which are connected along the branch circuit, in accordance with an embodiment.

FIG. 10 shows the example circuit of FIG. 7 in which a parallel line-to-neutral fault is detected between the diagnostic device 420, e.g., the Devices #1 and #2, in accordance with an embodiment. FIG. 11 shows the example circuit of FIG. 7 in which a parallel line-to-ground fault is detected between the Devices #1 and #2, in accordance with a further embodiment. When implementing a diagnostic process for detecting parallel faults, the diagnostic devices 420 would be configured (or switched) to operate in a high voltage supply mode with their loads (Rload) adjusted to maintain a low load current. For example, if high voltage was 10× low voltage, Rload would be adjusted by a 10x factor to maintain the same load current. The diagnostic system and method would check the current sensing for an increase in load current caused by the parallel fault path. An increase in monitored current on the neutral line N (e.g., neutral conductor) can indicate a parallel line-to-neutral fault (e.g., arcing from L to N). An increase in monitored current on the ground line G (e.g., earth ground) can indicate a parallel line-to-ground fault (e.g., arcing from L to G).

An example diagnostic process implementation for detection of a parallel line-to-neutral fault on the circuit configuration of FIGS. 7 and 10 is described with reference to Table 4, which is provided below.

TABLE 4

| Location | Voltage Level | Load Current on L | Load Current on G | Conclusion |
|---|---|---|---|---|
| Device #1 | High | >10 mA | 0 mA | Parallel line-to-neutral fault between Device #1 and Device #2 |
| Device #2 | High | 2 mA | 0 mA | No parallel fault |
| Device #3 | High | 5 mA | 0 mA | No parallel fault |

Table 4 describes an example parallel line-to-neutral fault (GF) detection analysis performed after a circuit mapping process. As shown in Table 4, the monitored load currents on Device #1 for L is >10 mA and G is 0 mA; the monitored load currents on Device #2 for L is 2 mA and G is 0 mA; and the monitored load currents on Device #3 for L is 5 mA and G is 0 mA. Based on this diagnostic information, it can be concluded that there is a parallel line-to-neutral fault between Device #1 and Device #2 as shown in FIG. 10 since the monitored current on L by Device #1 is greater than expected (e.g., >10 mA) and the monitored current on G by Device #1 is zero. In this example, there is no parallel fault on the section of the branch circuit between the circuit breaker 310 and Device #2 and the section of the branch circuit between Device #1 and Device #3 since the monitored ground G current in both of these sections is zero and the monitored power line L current in both sections is the expected current levels.

An example diagnostic process implementation for detection of a parallel line-to-ground fault on the circuit configuration of FIGS. 7 and 11 is described with reference to Table 5, which is provided below.

TABLE 5

| Location | Voltage Level | Load Current on L | Load Current on G | Conclusion |
|---|---|---|---|---|
| Device #1 | High | 10 mA | >0 mA (e.g., 1 mA) | Parallel line-to-ground fault between Device #1 and Device #2 |
| Device #2 | High | 2 mA | 0 mA | No parallel fault |
| Device #3 | High | 5 mA | 0 mA | No parallel fault |

Table 5 describes example parallel line-to-ground fault (GF) detection analysis performed after a circuit mapping process. As shown in Table 5 above, the monitored load currents on Device #1 for L is 10 mA and G is >0 mA (or 1 mA in this example); the monitored load currents on Device #2 for L is 2 mA and G is 0 mA; and the monitored load currents on Device #3 for L is 5 mA and G is 0 mA. Based on this diagnostic information, it can be concluded that there is a parallel line-to-ground fault between Device #1 and Device #2 as shown in FIG. 11 since the monitored current on G by Device #1 is greater than zero (e.g., >0 mA or 1 mA) and the monitored current on L by Device #1 is the expected current level (e.g., 10 mA). In this example, there is no parallel fault on the section of the branch circuit between the circuit breaker 310 and Device #2 and the section of the branch circuit between Device #1 and Device #3 since the monitored ground G current in both of these sections is zero and the monitored power line L current in both sections is the expected current levels.

The various implementations described above with respect to FIGS. 6-11 are simply provided as non-limiting examples. The circuit configuration may include any number of diagnostic devices installed on any number or all of different electrical outlets along a branch circuit to be monitored. Furthermore, additional ground and/or neutral break switches for selectively disconnecting the ground and/or neutral line may be integrated into the circuit breaker or panel board at the origin of the branch circuit for use in performing parallel and ground fault detection of the circuit section between the circuit breaker and a first outlet location (sometimes referred to as the "home run"). For example, in some embodiments, such a break switch may be employed to control and monitor a current return path (e.g., on neutral or ground) in order to distinguish the type of parallel fault, e.g., a line-to-neutral parallel fault or line-to-ground parallel fault, when a parallel fault is detected along the home run. An example of such a switch (e.g., 500) is shown in FIG. 5.

Figure 12:
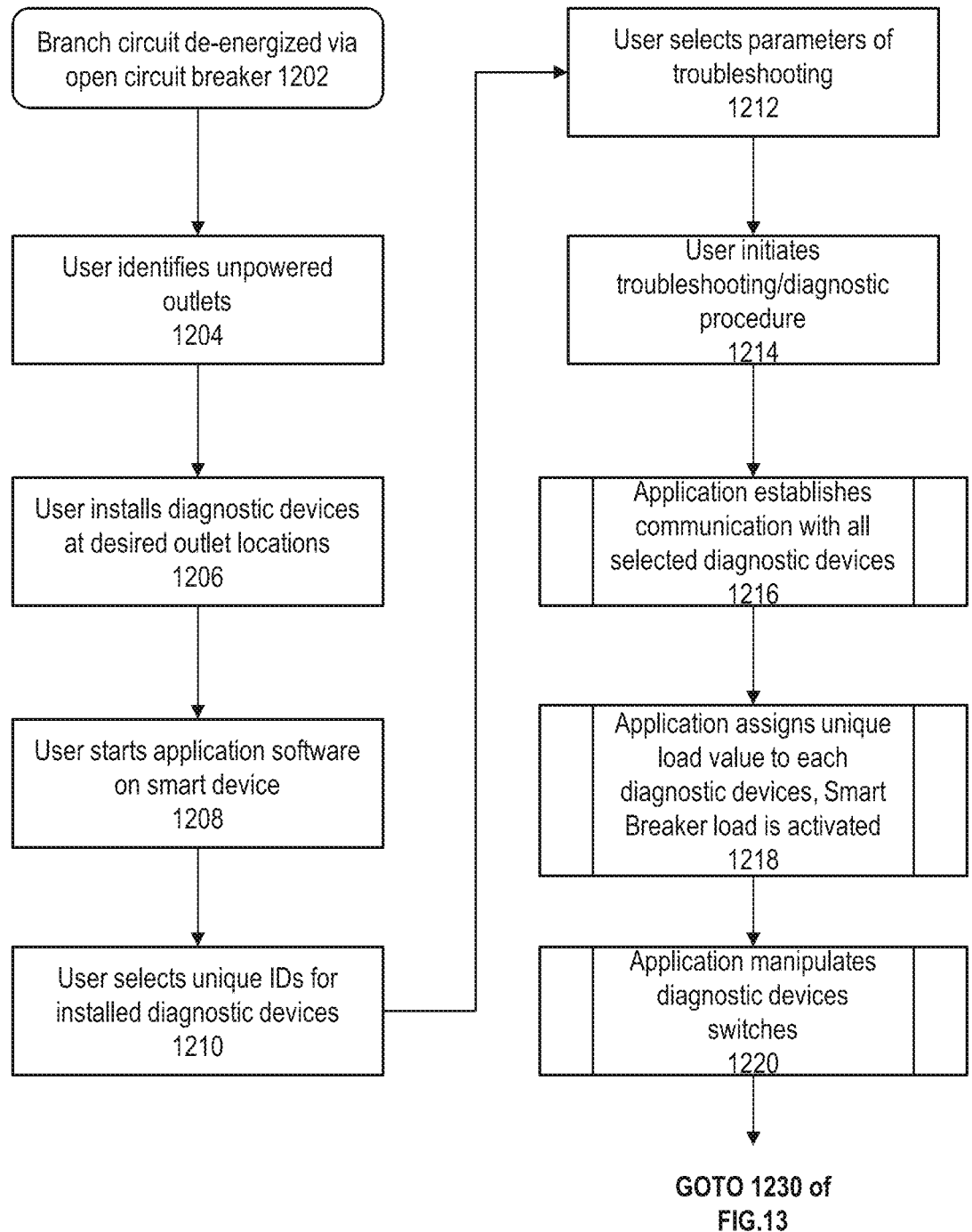
FIGS. 12 and 13 illustrate an example method of monitoring, analyzing and diagnosing conditions on a circuit, such as a branch circuit, in accordance with an embodiment.
Figure 13:
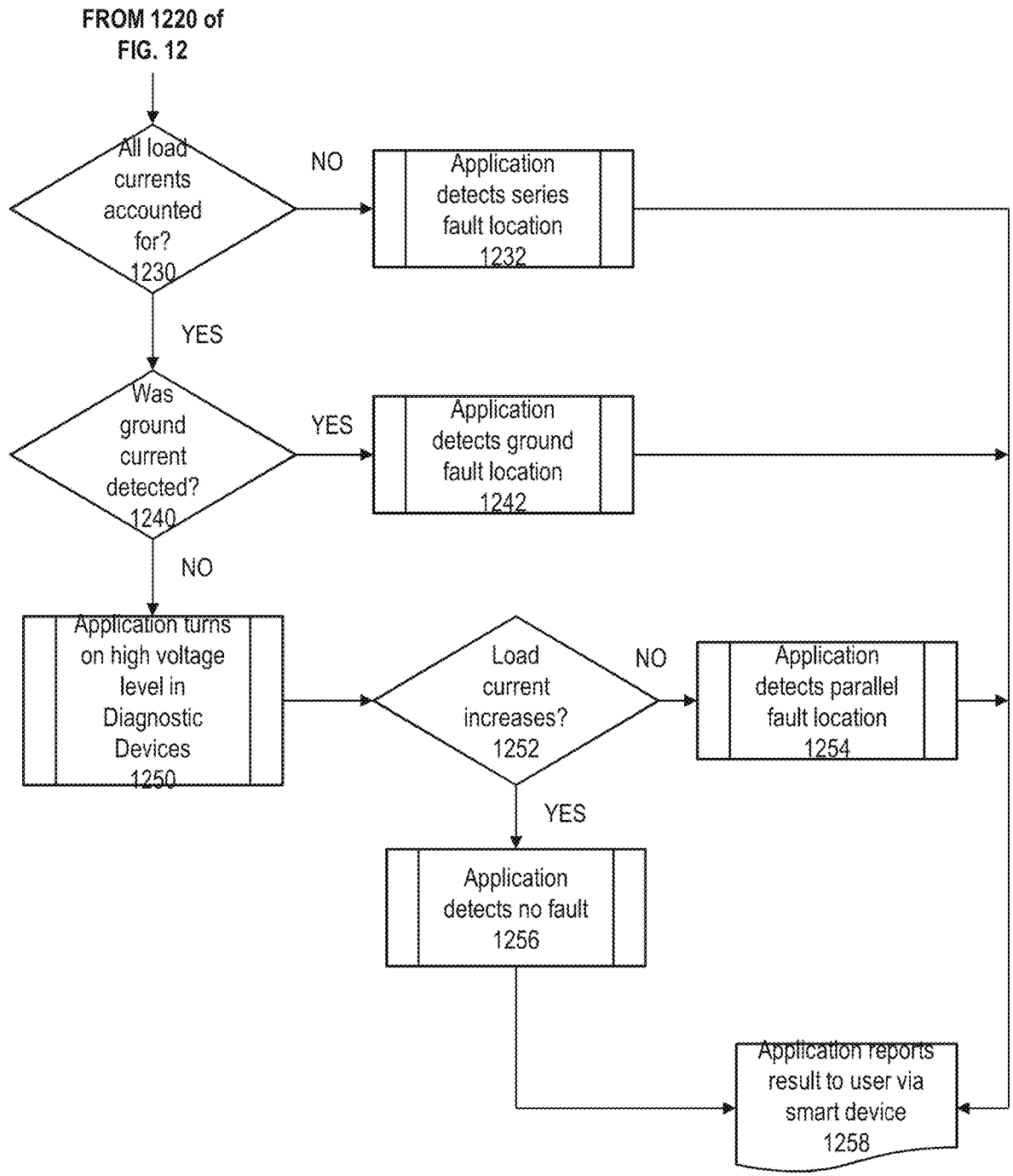

FIGS. 12 and 13 illustrate an example method 1200 of monitoring, analyzing and diagnosing conditions on a circuit, such as a branch circuit, in accordance with an embodiment. For the purposes of explanation, in this example, a smart device (e.g., 130 of FIG. 1) can interact with diagnostic devices (e.g., 120, 220, or 420 of FIG. 1, 2 or 4) and circuit breaker (e.g., 110 or 310 of FIG. 1 or 3), which are connected to the branch circuit, to perform outlet location mapping and fault diagnostics of the branch circuit.

The method 1200 begins at block 1202 in which a branch circuit is de-energized via open/tripped circuit breaker. The circuit breaker can be a smart breaker with a load which can be selectively activated or connected to the branch circuit, and a processor to control operations of the circuit breaker.

At block 1204, a user identifies unpowered electrical outlets of the branch circuit.

At block 1206, the user installs diagnostic devices at outlet locations. For example, the user connects the electrical connectors of a diagnostic device to the branch wirings of the upstream and downstream sections at the outlet location.

At block 1208, the user starts a circuit diagnosis process, which is implemented under control of an application software operating on a smart device (e.g., 130 of FIG. 1), such as for example a user operable computer device, to perform diagnosis of the branch circuit. As previously described, the smart device can, among other things, remotely control the operations of the circuit breaker and the installed diagnostic devices at outlet locations on the branch circuit. The smart device can be a smartphone, computer tablet, laptop, computer or other computer or computing device.

At block 1210, the user can select (or assign) unique identifiers (IDs) for the installed/connected diagnostic devices, such as through the smart device. Alternatively, the devices connected to the branch circuit may already be pre-assigned or set for unique identifiers.

At block 1212, the user can select parameters of troubleshooting through the smart device. The troubleshooting parameters can define the scope of the diagnostics to be performed, including the types of faults or conditions to be searched when diagnosing a circuit, the diagnostic devices or other devices to operate or control, and so forth.

At block 1214, the user can initiate a troubleshooting/diagnostic procedure through the smart device.

At block 1216, the smart device can establish communication with all selected diagnostic devices.

At block 1218, the smart device can assign unique load level (e.g., load level, amount or value) to each diagnostic device and activate the load on the smart circuit breaker. The smart device can set the power supply of the diagnostic devices to operate at a low voltage or current level, high or higher voltage or current level, or other desired voltage or current levels, by adjusting voltage level supplied and/or the load level for the loads of the diagnostic devices and the circuit breaker. In various embodiments, the smart device can remotely control the variable power supply at each diagnostic device to set the output voltage at a low or high voltage level for the diagnostic devices. A low voltage can be a voltage at touch safe levels.

At block 1220, the smart device can remotely control the diagnostic devices to manipulate the switching circuitry (e.g., switches) of the diagnostic devices. For example, in various embodiments, one diagnostic device can manipulate the switching circuitry at a time. In this way, the smart device can control the diagnostic devices and circuit breaker to check load currents under different power supply and load connection scenarios. For example, the diagnostic devices can be operated to isolate different sections of the branch circuit, to connect different loads or power supplies to the different sections, and to monitor load currents (e.g., for L, N and/or G) on the different sections of the branch circuit. These different sections can include, for example, the section between the circuit breaker and the first/closest outlet location with an installed diagnostic device, and the sections between the installed diagnostic devices along the branch circuit (see, e.g., example circuit sections shown in the examples of FIGS. 1 and 6). The diagnostic information corresponding to monitored load currents from the diagnostic devices can be transmitted to the smart device, via wireless communication, such as over a star, mesh or other network. The smart device can receive diagnostic information relating to monitored load currents for the different sections of the branch circuit from the diagnostic devices (or diagnostic devices and circuit breaker). In various embodiments, the circuit breaker may also provide diagnostic information to the smart device, if the circuit breaker is configured to incorporate sensors for monitoring load currents or the like.

At block 1230, the smart device determines whether all load currents have been accounted for the different sections of the circuit breaker based on the received diagnostic information from the diagnostic devices (or diagnostic devices and circuit breaker). If all load currents are not accounted for (e.g., inconclusive load currents monitored on a section(s)), the smart device can detect a series fault and its location at block 1232 and reports the result to the user at block 1258. For example, a series fault is detected for a section(s) in which no load currents (e.g., 0 mA) have been detected. An operational example has been previously described above with reference to the example circuit configuration of FIG. 8. The report can be outputted (e.g., displayed) at the device to the user, or electronically transmitted to another user computer device or a central reporting or management facility.

If all load currents are accounted for at block 1230, the smart device determines whether ground current has been detected at block 1240 based on the received diagnostic information from the diagnostic devices and the circuit breaker. If a ground current is detected, the smart device detects the ground fault and its location at block 1242 and reports the result to the user at block 1258. An operational example has been previously described above with respect to the example circuit configuration of FIG. 9. The report can be outputted (e.g., displayed) at the device to the user, or electronically transmitted to another user computer device or a central reporting or management facility.

If ground current has not been detected at block 1240, the smart device can have the diagnostic devices operate to supply power at a high voltage level. For example, the smart device can remotely set the supply voltage at a high voltage level for the diagnostic devices. After the voltage level is set at the high level, the smart device can control the diagnostic devices and circuit breaker to check their load currents under different power supply and load connection scenarios to monitor load currents for different sections of the branch circuit. The smart device can receive diagnostic information relating to monitored load currents from the diagnostic devices. The diagnostic information can be transmitted to the smart device, via wireless communication, over a network.

At block 1252, the smart device can determine whether the load current has increased beyond an expected current level based on the received diagnostic information from the diagnostic devices (or diagnostic devices and circuit breaker). If the load current has increased, the smart device detects a parallel fault location at block 1254 and reports the result to the user at block 1258. An operational example of detection of parallel line-to-neutral and line-to-ground faults have been previously been described above with respect to the example circuit configuration of FIGS. 10 and 11. The report can be outputted (e.g., displayed) at the device to the user, or transmitted to another user computer device or a central reporting or management facility.

If the load current has not increased, the smart device detects no fault (or does not detect a fault) on the circuit at block 1256 and reports the result to the user at block 1258. The report can be outputted (e.g., displayed) at the device to the user, or transmitted to another user computer device or a central reporting or management facility.

The above describes one example method of performing diagnosis of a branch circuit. The various operations performed above by the smart device can alternatively be performed at or through one of the diagnostic devices (e.g., a master diagnostic device), which can then transmit a report on the diagnosed state of the branch circuit to a user device. Various operations described above by the smart device may be performed based on parameters or settings, which are predefined and/or provided by a user.

Figure 14:
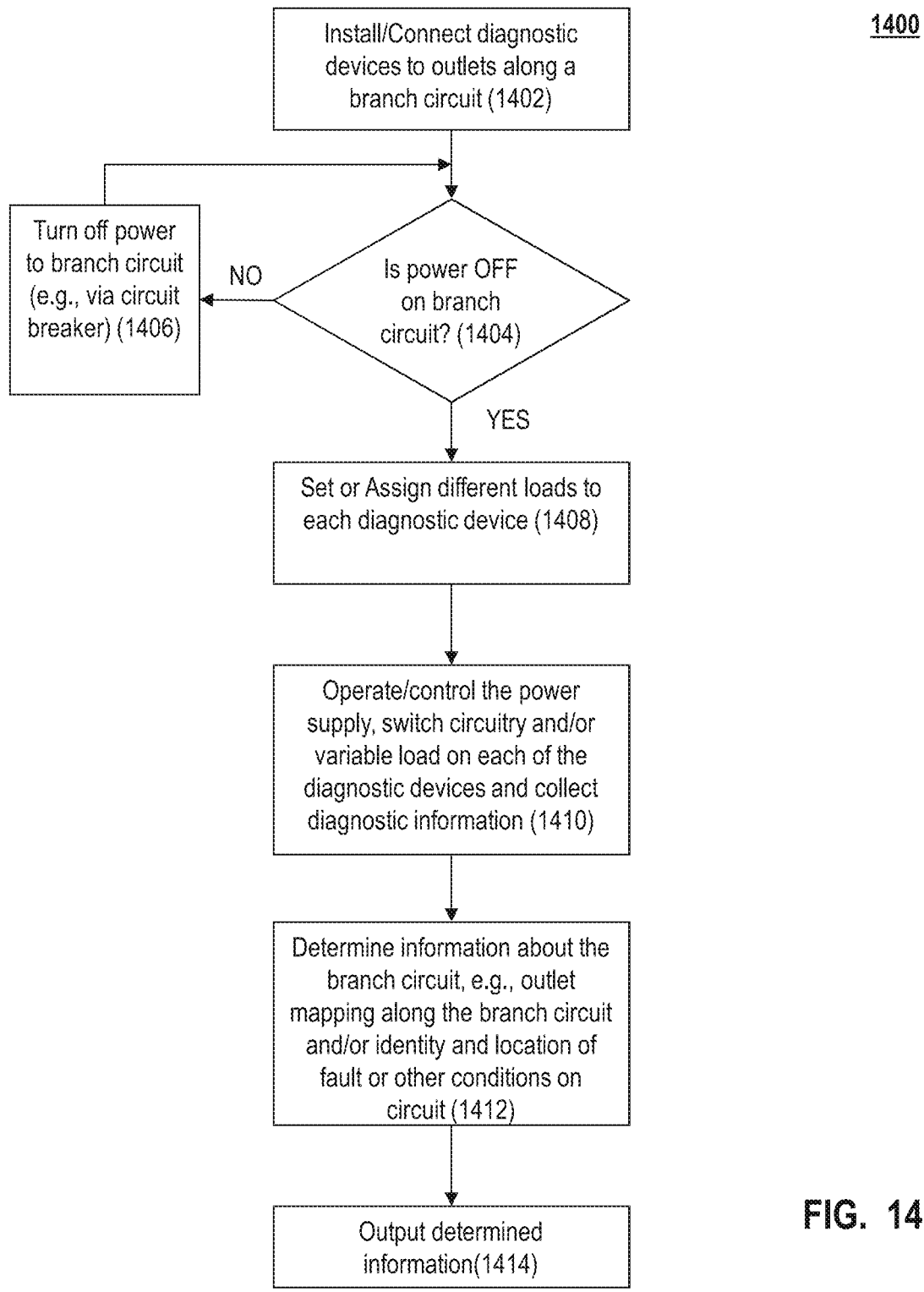
FIG. 14 illustrates example method of monitoring, analyzing and diagnosing conditions on a circuit, such as a branch circuit, in accordance with an embodiment.

FIG. 14 illustrates example method 1400 of monitoring, analyzing and diagnosing conditions on a circuit, such as a branch circuit, in accordance with an embodiment.

At block 1402, diagnostic devices are installed (or connected) at different outlet locations along a branch circuit.

At block 1404, a determination is made whether the power is off on the branch circuit (e.g., circuit breaker is in the TRIP/OFF position). If not, the power is turned off to the branch circuit, via the circuit breaker (e.g., turning the circuit breaker to the OFF position) at block 1406. If the power is off, different loads can be set or assigned to each diagnostic device, as well as the circuit breaker at block 1408. As described herein, the diagnostic devices and the circuit breaker can each have a variable load.

At block 1410, the diagnostic devices and the circuit breaker can be operated or controlled to provide different power supply and load connection scenarios to isolate and monitor load currents on different sections of the branch circuit. To monitor load currents on the different sections, diagnostic information corresponding to the monitored load currents on upstream and downstream sections of the branch circuit from the outlet location are sensed, measured, calculated or derived from electrical characteristics (e.g., current or voltage) measured on the conductors of the branch circuit by sensor(s) on the diagnostic devices. For example, each diagnostic device can measure load currents on an isolated circuit section using a neutral current sensor and a ground current sensor (see, e.g., FIG. 4). Under normal circuit conditions, the expected current across the power line L is equal to the neutral N current plus the ground G current. Each diagnostic device can also measure current across its load (Rload) using a current or voltage sensor, or measure current on the power line (L) using a power line current sensor. The load currents (e.g., the current across conductors L, N and G) on the branch circuit or section thereof can be sensed, measured, calculated or derived using different types or combinations of current and/or voltage sensors on the diagnostic devices (and, if desired, also on the circuit breaker).

At block 1412, various information about the branch circuit can be determined based on the diagnostic information from the diagnostic devices and the circuit breaker, which are obtained for different power supply levels (e.g., low or high voltage). The determined information can include the mapping (or order) of the outlets/outlet locations along the branch circuit, the identity and location of a fault on the branch circuit, or other conditions on the circuit.

At block 1414, the determined information for the branch circuit can be output to the user/user device, as a report or in some other format.

The various operations described in the above example of FIG. 14 can be performed under control of a primary or central computer device (e.g., a smart device, a master diagnostic box, etc.). As described herein, in various embodiments, a computer device, operated by a user, may interact with the diagnostic devices and the circuit breaker to coordinate, control, and/or implement one or more of the above operations of the method 1400 of FIG. 14.

Figure 15:
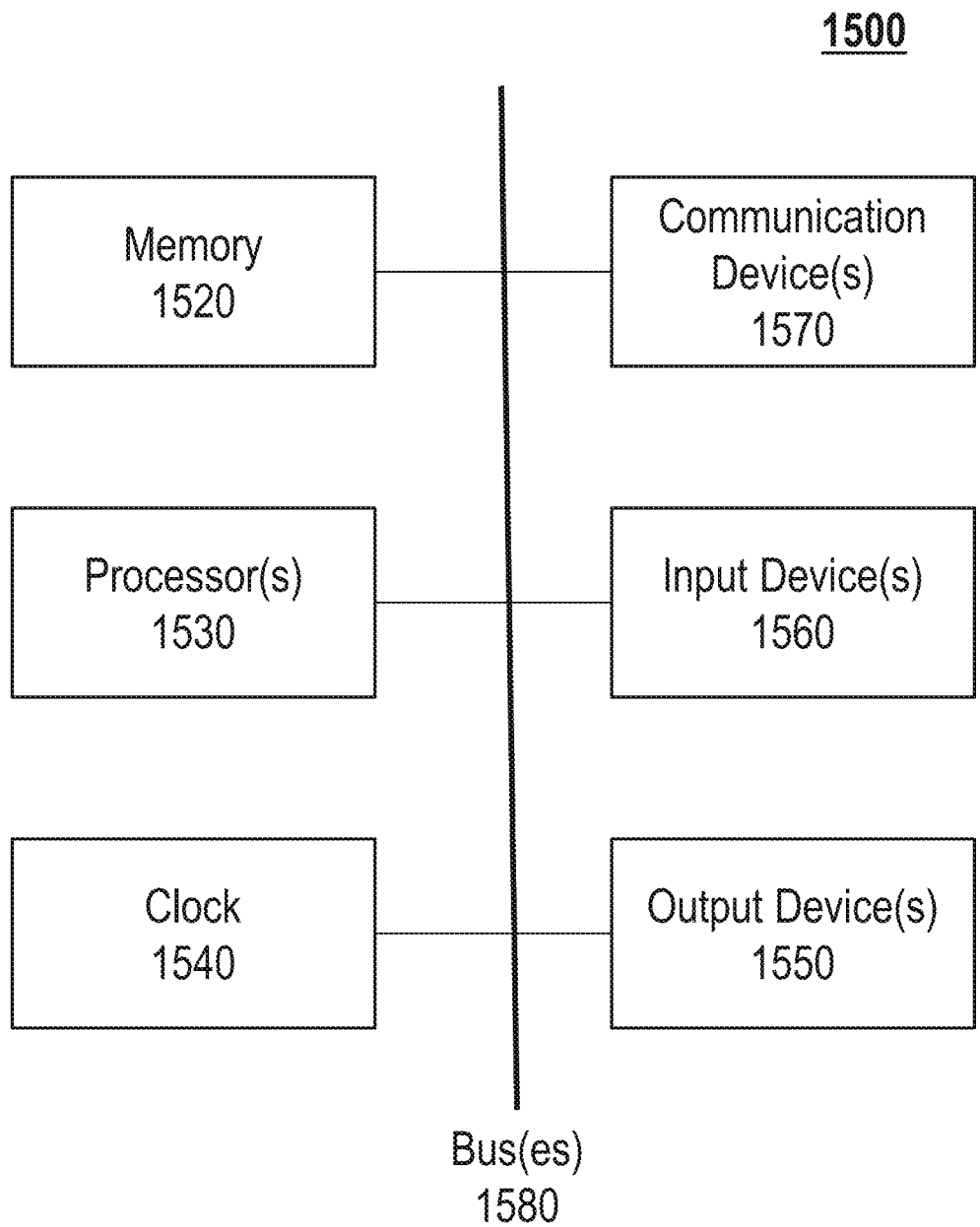
FIG. 15 illustrates example components of a computer or computing system, in accordance with an embodiment.

FIG. 15 illustrates example components of a computer device or system 1500, in accordance with an embodiment. As shown in FIG. 15, the computer system 1500 can include, for example, memory 1520, processor(s) 1530, clock 1540, output device(s) 1550, input device(s) 1560, communication device 1570, and a bus system 1580 between the components of the computer system.

The memory 1520 can store computer executable code, programs, software or instructions, which when executed by a processor(s), controls the operations of the computer system 1500, including the various methods/processes described herein. The memory 1520 can also store other data used by the computer system 1500 or components thereof to perform the operations described herein. The other data can include but is not limited to identifiers for remote devices including but not limited to diagnostic devices and circuit breaker, and their device parameters (e.g., value of the load(s), power supply, voltage supply, current supply, monitored load currents, etc.), physical or scientific laws, and other information described herein. Memory/storage devices can include, but are not limited to, disks, solid state drives, optical disks, removable memory devices such as smart cards, SIMS, WIMs, semiconductor memories such as RAM, ROM, PROMS, etc.

The output device(s) 1550 can include a display device, printing device, speaker, and so forth. For example, the output device(s) 1550 may output for display or present graphical user interface (GUI), diagnostic reports of circuit under analysis, or other data or information, such as described herein.

The input device(s) 1560 can include any user input device such as a mouse, trackball, microphone, touch screen, a joystick, control console, keyboard/pad, touch screen or other device operable by a user. The input device(s) 1560 may also accept data from external sources, such other devices and systems.

The processor(s) 1530, which interacts with the other components of the computer system, is configured to control or implement the various operations described herein. These operations can include implementing or controlling circuit monitoring, analysis and diagnosis, and other processes described herein. A processor(s) as described herein can be a processing system, which can include one or more processors, such as CPU, GPU, controller, dedicated circuitry or other processing unit, which controls the operations of the devices or systems, described herein.

The communication system 1570 can perform communications across a transmitting medium or network. Transmitting mediums or networks can include, but are not limited to, transmission via wireless communication (e.g., Radio Frequency (RF) communication, Bluetooth®, Wi-Fi, Li-Fi, etc.), wireline communication, the Internet, intranets, telephone/modem-based network communication, hard-wired/cabled communication network, satellite communication, star network, mesh network, and other stationary or mobile network systems/communication links.

The above describes example components of a computer device or system such as a computer, portable computer (such as a smart device, smart phone, laptop computer, tablet computer, and so forth), server or other data processing system. The output device and input devices 1550 and 1560 respectively may communicate with the processor 1530 over a local bus or a network. The computer device or system may be a standalone device or a distributed processing system.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. A diagnostic device for performing diagnostics on a branch circuit of an electrical system, the branch circuit having a plurality of electrical conductors including a power line, neutral line and ground line, the diagnostic device comprising:
   electrical connectors including a first set of terminals for connecting to the electrical conductors of the branch circuit in an upstream direction at an electrical outlet location, and a second set of terminals for connecting to the electrical conductors of the branch circuit in a downstream direction at the electrical outlet location;
   a load;
   a power supply;
   switching circuitry, which is coupled to the first and second sets of terminals of the electrical connectors, the load and the power supply, for isolating an upstream or downstream section of the branch circuit from the electrical outlet, and selectively connecting or disconnecting the power supply or the load to the section of the branch circuit upstream or downstream from the electrical outlet location, via the electrical connectors; and
   sensors for measuring electrical characteristics of the electrical conductors on the branch circuit to monitor current on the power, neutral and ground lines; and
   at least one processor configured: to control the switching circuitry to selectively connect either the power supply or the load to the portion of the branch circuit either upstream or downstream from the electrical outlet location; and to obtain diagnostic information corresponding to the monitored current on the power, neutral and ground lines based on the measurements performed by the sensors,
   wherein the load is a variable load, and wherein the at least one processor is further configured to set the variable load to a load level which is different than other loads connected on the branch circuit.

2. The device of claim 1, wherein the power supply is a variable power supply, and the processor is further configured to control an amount of power supplied by the variable power supply to the isolated section of the branch circuit either upstream or downstream from the electrical outlet location.

3. The device of claim 2, wherein the switching circuitry is operable in first and second switching configurations in which the upstream and downstream sections of the branch circuit are isolated from each other at the electrical outlet location, the first switching configuration connecting the power supply to the upstream section and the load to the downstream section, the second switching configuration connecting the power supply to the downstream section and the load to the upstream section.

4. The device of claim 3, wherein the switching circuitry is operable in a third switching configuration in which the upstream and downstream sections of the branch circuit are electrically connected at the electrical outlet location.

5. The device of claim 2, wherein the power level of the power supply is controllable to output voltage at a selectable level from one of a first voltage level that can energize an arc fault and a second voltage level that cannot energize an arc fault.

6. The device of claim 1, wherein a level of voltage supplied by the power supply and/or a level of load connectable to the branch circuit is selectively controllable to limit current on the branch circuit to a current level which can prevent or reduce a potential hazardous arc fault from reaching a hazardous level.

7. A diagnostic system comprising:
   a circuit breaker, arranged at an origin of the branch circuit, the circuit breaker including a load selectively connectable to the branch circuit, wherein the circuit breaker comprises a circuit breaker communication device;
   a plurality of the diagnostic devices of claim 1, wherein the first diagnostic device of the plurality of diagnostic devices comprises a first communication device and the first diagnostic device is configured to connect to the electrical conductors of the branch circuit at a first electrical outlet location along the branch circuit, wherein the first diagnostic device includes switching circuitry operable to provide different combinations of power supply and load connections along the branch circuit to isolate and monitor load currents on a first section of the branch circuit, wherein the first section comprises a section between electrical outlet locations having diagnostic devices connected thereto; and
   a computer device including a processor, memory and a communication device, the computer device being configured:
      to remotely control operations of the circuit breaker and the plurality of diagnostic devices for selectively isolating different sections of the branch circuit and monitoring load currents on the isolated sections of the branch circuit,
      to receive diagnostic information from the circuit breaker and the plurality of the diagnostic devices via the communication device of the computer device,
   the received diagnostic information including information corresponding to the monitored load currents for the first section of the branch circuit, and
      to determine the type and location of a fault on the branch circuit based on the received diagnostic information, or the mapping of the electrical outlet locations along the branch circuit based on the received diagnostic information.

8. The system of claim 7, wherein the computer device is further configured to report to a user the type and location of a fault or the mapping of the electrical outlet locations.

9. The system of claim 7, wherein the computer device is configured to control the diagnostic devices and the circuit breaker to obtain diagnostic information for use to analyze one or more types of faults defined by a user via a user input device, or defined by a type(s) of fault protected against by the circuit breaker.

10. The system of claim 7, further comprising a ground break switch to selectively disconnect ground upstream from the plurality of electrical outlet locations, the ground break switch being operable to disconnect ground when monitoring load currents for detecting ground fault and distinguish line-to-neutral parallel fault and line-to-ground parallel fault along the section of the branch circuit between the circuit breaker and a closest one of the electrical outlet locations to the circuit breaker which has a diagnostic device connected thereto.

11. A method of performing diagnostics on a branch circuit with a plurality of electrical outlet locations in an electrical system, the branch circuit having a plurality of electrical conductors including a power line, neutral line and ground line, the method comprising:
  connecting a plurality of diagnostic devices to upstream and downstream electrical conductors of the branch circuit at different electrical outlet locations, each diagnostic device including: a load, a power supply, sensors for measuring electrical characteristics on the branch circuit to monitor current on the power, neutral and ground lines, and switching circuitry for isolating an upstream or downstream section of the branch circuit from the electrical outlet and for selectively connecting or disconnecting the power supply or the load to the section of the branch circuit upstream or downstream from the electrical outlet location, via the electrical connectors;
  controlling the switching circuitry of each of the plurality of diagnostic devices to provide different combinations of power supply and load connections along the branch circuit in order to isolate and monitor load currents on different sections of the branch circuit including sections between electrical outlet locations having diagnostic devices connected thereto; and
  determining a type and location of a fault on the branch circuit based on the monitored load currents, or a mapping of the outlet locations along the branch circuit based on the monitored load currents,
  wherein diagnostic operations are performed under control of a computer device, and the determining operation is performed by the computer device based on diagnostic information corresponding to monitored loads, which are received from the plurality of diagnostic devices.

12. The method of claim 11, wherein the loads of at least one of the diagnostic devices or the circuit breaker is a variable load, the method further comprising:
  setting the variable load to a load level which is different than other loads connected on the branch circuit.

13. The method of claim 12, wherein the power supply of one of the diagnostic devices is a variable power supply, the method further comprising:
  controlling a level of power supplied by the variable power supply to the section of the branch circuit either upstream or downstream from the electrical outlet location at which the one of the diagnostic devices is connected.

14. The method of claim 11, further comprising:
  controlling the power level of the power supply of one or more of the diagnostic devices to output voltage at a selectable level from one of a first voltage level that can energize an arc fault and a second voltage level that cannot energize an arc fault.

15. The method of claim 11, further comprising:
  selectively controlling a level of voltage supplied by the power supply and/or a level of load on the branch circuit to limit current on the branch circuit to a current level which can prevent or reduce a potential hazardous arc fault from reaching a hazardous level.

16. A tangible computer memory device storing computer executable code, which when executed by a computer, implements a method of performing diagnostics on a branch circuit with a plurality of electrical outlet locations in an electrical system, the branch circuit having a plurality of electrical conductors including a power line, neutral line and ground line, a plurality of diagnostic devices being connected to upstream and downstream electrical conductors of the branch circuit at different electrical outlet locations, each diagnostic device including: a load, a power supply, sensors for measuring electrical characteristics on the branch circuit to monitor current on the power, neutral and ground lines, and switching circuitry for isolating an upstream or downstream section of the branch circuit from the electrical outlet and for selectively connecting or disconnecting the power supply or the load to the section of the branch circuit upstream or downstream from the electrical outlet location, via the electrical connectors, the method comprising:
  controlling the switching circuitry of each of the plurality of diagnostic devices to provide different combinations of power supply and load connections along the branch circuit in order to isolate and monitor load currents on different sections of the branch circuit including sections between electrical outlet locations having diagnostic devices connected thereto; and
  determining a type and location of a fault on the branch circuit based on the monitored load currents, or a mapping of the outlet locations along the branch circuit based on the monitored load currents,
  wherein diagnostic operations are performed under control of a computer device, and the determining operation is performed by the computer device based on diagnostic information corresponding to monitored loads, which are received from the plurality of diagnostic devices.

17. A diagnostic device for performing diagnostics on a branch circuit of an electrical system, the branch circuit having a plurality of electrical conductors including a power line, neutral line and ground line, the diagnostic device comprising:
  electrical connectors including a first set of terminals for connecting to the electrical conductors of the branch circuit in an upstream direction at an electrical outlet location, and a second set of terminals for connecting to the electrical conductors of the branch circuit in a downstream direction at the electrical outlet location;
  a load;
  a power supply;
  switching circuitry, which is coupled to the first and second sets of terminals of the electrical connectors, the load and the power supply, for isolating an upstream or downstream section of the branch circuit from the electrical outlet, and selectively connecting or disconnecting the power supply or the load to the section of the branch circuit upstream or downstream from the electrical outlet location, via the electrical connectors; and
  sensors for measuring electrical characteristics of the electrical conductors on the branch circuit to monitor current on the power, neutral and ground lines; and
  at least one processor configured: to control the switching circuitry to selectively connect either the power supply or the load to the portion of the branch circuit either upstream or downstream from the electrical outlet location; and to obtain diagnostic information corresponding to the monitored current on the power, neutral and ground lines based on the measurements performed by the sensors,
  wherein the power supply is a variable power supply, and wherein the at least one processor is further configured to control an amount of power supplied by the variable power supply to the isolated section of the branch circuit either upstream or downstream from the electrical outlet location.

18. A diagnostic device for performing diagnostics on a branch circuit of an electrical system, the branch circuit having a plurality of electrical conductors including a power line, neutral line and ground line, the diagnostic device comprising:

electrical connectors including a first set of terminals for connecting to the electrical conductors of the branch circuit in an upstream direction at an electrical outlet location, and a second set of terminals for connecting to the electrical conductors of the branch circuit in a downstream direction at the electrical outlet location;

a load;

a power supply;

switching circuitry, which is coupled to the first and second sets of terminals of the electrical connectors, the load and the power supply, for isolating an upstream or downstream section of the branch circuit from the electrical outlet, and selectively connecting or disconnecting the power supply or the load to the section of the branch circuit upstream or downstream from the electrical outlet location, via the electrical connectors; and sensors for measuring electrical characteristics of the electrical conductors on the branch circuit to monitor current on the power, neutral and ground lines; and at least one processor configured: to control the switching circuitry to selectively connect either the power supply or the load to the portion of the branch circuit either upstream or downstream from the electrical outlet location; and to obtain diagnostic information corresponding to the monitored current on the power, neutral and ground lines based on the measurements performed by the sensors, wherein a level of voltage supplied by the power supply and/or a level of load connectable to the branch circuit is selectively controllable to limit current on the branch circuit to a current level which can prevent or reduce a potential hazardous arc fault from reaching a hazardous level.

\* \* \* \* \*